United States Patent
Wu et al.

(10) Patent No.: US 12,255,105 B2
(45) Date of Patent: Mar. 18, 2025

(54) GATE-ALL-AROUND DEVICES HAVING GATE DIELECTRIC LAYERS OF VARYING THICKNESSES AND METHOD OF FORMING THE SAME

(71) Applicant: Taiwan Semiconductor Manufacturing Co., Ltd., Hsin-Chu (TW)

(72) Inventors: Pei-Hsun Wu, Hsinchu (TW); Ming-Hung Han, Hsinchu (TW); Po-Nien Chen, Miaoli County (TW); Chih-Yung Lin, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 523 days.

(21) Appl. No.: 17/363,837

(22) Filed: Jun. 30, 2021

(65) Prior Publication Data

US 2021/0327765 A1   Oct. 21, 2021

Related U.S. Application Data

(63) Continuation of application No. 16/728,154, filed on Dec. 27, 2019, now Pat. No. 11,056,396.

(51) Int. Cl.
*H01L 21/8234* (2006.01)
*H01L 27/088* (2006.01)
(Continued)

(52) U.S. Cl.
CPC ........ *H01L 21/823462* (2013.01); *H01L 21/823412* (2013.01); *H01L 21/823431* (2013.01);
(Continued)

(58) Field of Classification Search
CPC ..... H01L 29/0669–068; H01L 29/0665; H01L 2924/13061; H01L 29/66439;
(Continued)

(56) References Cited

U.S. PATENT DOCUMENTS 10,038,079 B1 * 7/2018 Ohtou ............. H01L 21/823431
10,629,501 B2   4/2020 Doornbos et al.
(Continued)

FOREIGN PATENT DOCUMENTS

TW   201801292 A   1/2018
TW   201906162 A   2/2019
(Continued)

*Primary Examiner* — Evren Seven
*Assistant Examiner* — Cole Leon Lindsey
(74) *Attorney, Agent, or Firm* — HAYNES AND BOONE, LLP

(57) ABSTRACT

A semiconductor device includes a substrate having a first region and a second region, a first transistor in the first region, a second transistor in the first region, and a third transistor in the second region. The first transistor includes a first channel layer and a first gate dielectric layer on the first channel layer. The second transistor includes a second channel layer and a second gate dielectric layer on the second channel layer. The second gate dielectric layer is thicker than the first gate dielectric layer. The third transistor includes a third channel layer and a third gate dielectric layer on the third channel layer. The third gate dielectric layer is thicker than the second gate dielectric layer.

20 Claims, 19 Drawing Sheets

(51) Int. Cl.
*H01L 29/06* (2006.01)
*H01L 29/10* (2006.01)
*H01L 29/423* (2006.01)
*H01L 29/66* (2006.01)
*H01L 29/78* (2006.01)

(52) U.S. Cl.
CPC ...... *H01L 27/0886* (2013.01); *H01L 29/0673* (2013.01); *H01L 29/1037* (2013.01); *H01L 29/42376* (2013.01); *H01L 29/66795* (2013.01); *H01L 29/785* (2013.01); *H01L 29/7854* (2013.01)

(58) Field of Classification Search
CPC ........... H01L 29/66469; H01L 29/7853; H01L 29/78687; H01L 29/78696; Y10S 977/938
See application file for complete search history.

(56) References Cited

U.S. PATENT DOCUMENTS

| | | | |
|---|---|---|---|
| 10,700,064 B1* | 6/2020 | Zhang | .................. H01L 29/78 |
| 10,734,286 B1 | 8/2020 | Ando et al. | |
| 10,763,177 B1 | 9/2020 | Zhang et al. | |
| 2011/0120374 A1* | 5/2011 | Bevan | ............... H01L 21/02326 |
| | | | 118/719 |
| 2014/0084387 A1* | 3/2014 | Dewey | .............. H01L 21/28264 |
| | | | 257/E21.409 |
| 2014/0312396 A1* | 10/2014 | Ito | ......................... H01L 29/785 |
| | | | 257/288 |
| 2019/0131189 A1 | 5/2019 | Doornbos | |
| 2019/0312120 A1 | 10/2019 | Zhang et al. | |
| 2020/0066839 A1 | 2/2020 | Zhang et al. | |
| 2020/0168715 A1 | 5/2020 | Wu et al. | |
| 2020/0343387 A1 | 10/2020 | Liaw | |
| 2020/0381432 A1 | 12/2020 | Lee et al. | |

FOREIGN PATENT DOCUMENTS

| | | |
|---|---|---|
| TW | 201911404 A | 3/2019 |
| TW | 201926419 A | 7/2019 |
| TW | 201926420 A | 7/2019 |
| TW | 201933492 A | 8/2019 |
| TW | 201937659 A | 9/2019 |
| TW | 201937770 A | 9/2019 |

* cited by examiner

GATE-ALL-AROUND DEVICES HAVING GATE DIELECTRIC LAYERS OF VARYING THICKNESSES AND METHOD OF FORMING THE SAME

PRIORITY

This is a continuation of U.S. patent application Ser. No. 16/728,154, filed on Dec. 27, 2019, the entire disclosure of which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as IC technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Gate-all-around (GAA) transistors are examples of multi-gate devices that have become popular and promising candidates for high performance and low leakage applications. Compared to planar transistors, such configuration provides better control of the channel and drastically reduces SCEs (in particular, by reducing sub-threshold leakage). A GAA transistor has a gate structure that can extend, partially or fully, around a channel region to provide access to the channel region on all sides. The channel region of the GAA transistor may be formed from nanowires, nanosheets, other nanostructures, and/or other suitable structures. In some implementations, such channel region includes multiple nanowires (which extend horizontally, thereby providing horizontally-oriented channels) vertically stacked.

IC devices include transistors that serve different functions, such as input/output (I/O) functions and core functions. These different functions require the transistors to have different constructions. At the same time, it is advantageous to have similar processes and similar process windows to fabricate these different transistors to reduce cost and improve yield. Although existing GAA transistors and processes are generally adequate for their intended purposes, they have not been entirely satisfactory in every aspect. For example, different core functions, such as high-speed application and low-power (and/or low-leakage) application, may prefer different gate dielectric layer thicknesses for GAA transistors. Therefore, how to continuously scale down gate stacks for I/O devices and core devices with varying gate dielectric layer thicknesses suiting different applications is a challenge faced by the semiconductor industry. The present disclosure aims to solve the above issues and other related issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
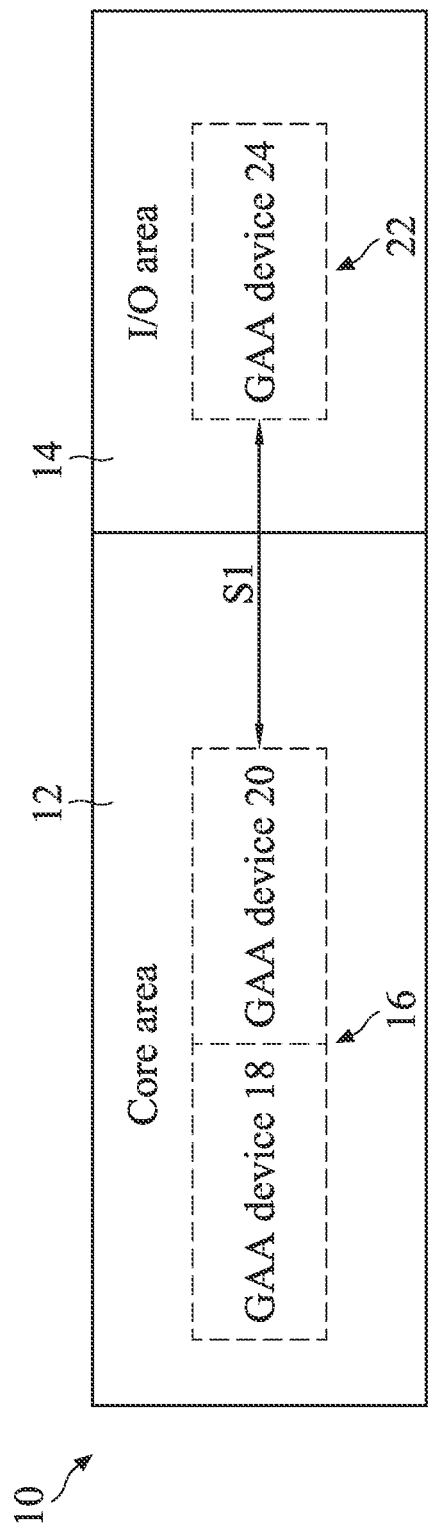
FIGS. 1A and 1B shows a schematic block diagram of a semiconductor device and respective fragmentary cross-sectional view of three gate stacks for I/O and core devices, according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices, and more particularly to integrate circuits (IC) having input/output (I/O) devices (or transistors) and core devices (or transistors) with nanowire channels on the same substrate. In an embodiment, at least two gate-all-around (GAA) devices with stacked nanowire channels are placed in a core area of the IC, for example, for implementing high-speed application and low-power (and/or low-leakage) application respectively, while a third GAA device is placed in an I/O area of the IC for implementing I/O application (including electrostatic discharge (ESD) application).

Operating voltage for the I/O area may be similar to external voltage (voltage level of the external/peripheral circuitry) and is higher than the operating voltage of the core area. To accommodate the higher operating voltage, transistors in the I/O area may have a thicker gate dielectric layer as compared to their counterparts in the core area. In the core area, thicknesses of gate dielectric layers of transistors correlate with circuit speed and leakage performance. With a thinner gate dielectric layer, a GAA device is more suitable for high-speed application. With a thicker gate dielectric layer, a GAA device is more suitable for low-power (and/or low-leakage) application. To further the embodiment, the GAA device for high-speed application has a thinner gate dielectric layer than the GAA device for low-power (and/or low-leakage) application. Embodiments of the present disclosure provide flexible design integration schemes to accommodate different circuits in the same IC. Fabrication methods according to the present disclosure can be readily integrated into existing semiconductor manufacturing flows. Details of the various embodiments of the present disclosure are described by reference to the FIGS. 1A-18.

Figure 1B:
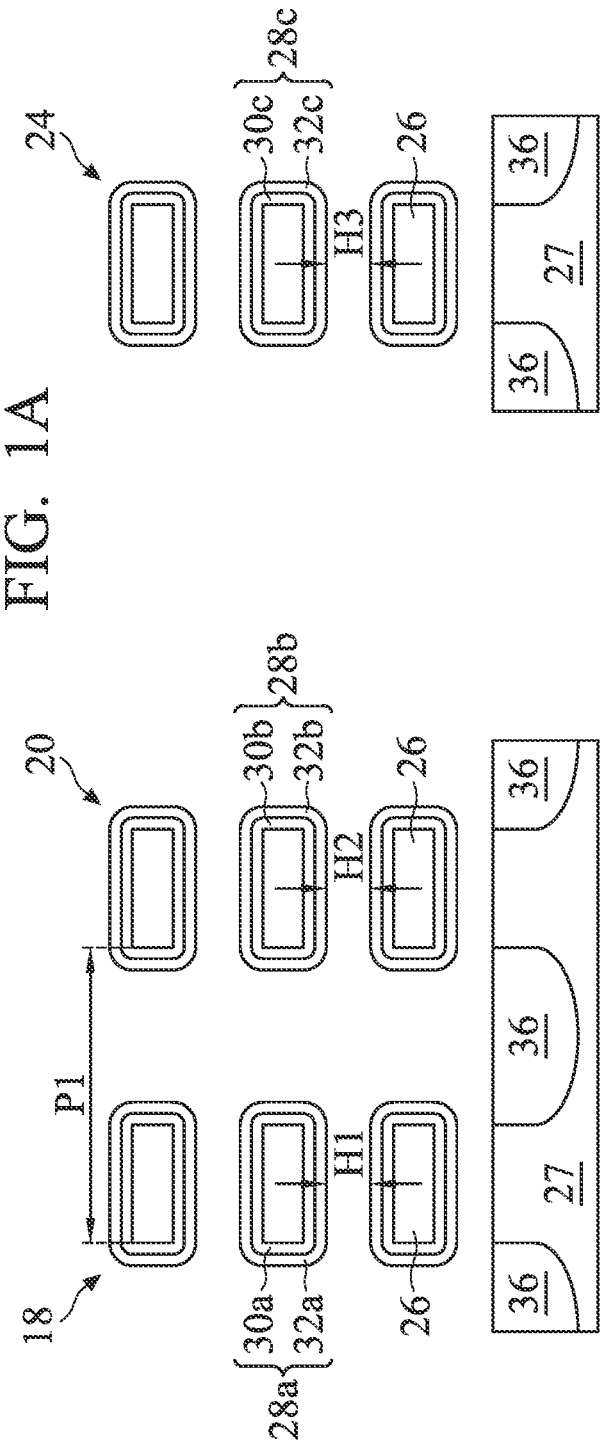

Referring to FIGS. 1A and 1B collectively, shown therein is a schematic block diagram of a semiconductor structure 10 (e.g., an IC 10) constructed according to an embodiment of the present disclosure. The IC 10 includes a core area 12 and an I/O area 14. The core area 12 includes logic circuits, memory circuits, and other core circuits. The I/O area 14 includes I/O cells, ESD cells, and other circuits. The core area 12 includes a device region 16 where a GAA device 18 and a GAA device 20 are formed. In some embodiments, the GAA device 18 and the GAA device 20 are placed adjacent to each other (or abutted), as illustrated in FIG. 1B, which is a fragmentary cross-sectional view. In some other embodiments, the GAA device 18 and the GAA device 20 are separated, such as by other GAA devices therebetween or in different device regions of the core area 12. The I/O area 14 includes a device region 22 where a third GAA device 24 is formed. The GAA device 24 is located away from the GAA devices 18 and 20 by spacing "S1" In the illustrated embodiment, spacing S1 is at least four (4) times of a gate pitch of the GAA devices 18 or 20 or at least four (4) times of a channel pitch of the GAA devices 18 or 20. The gate pitch and the channel pitch can be defined using center-to-center distance or edge-to-edge distance between two adjacent gates or channels. An exemplary channel pitch P1 is illustrated in FIG. 1B as the edge-to-edge distance between two adjacent channels. The spacing S1 is designed to ease manufacturing process by providing margins when patterning the device regions 16 and 22.

Each of the three GAA devices 18, 20, and 24 includes vertically stacked multiple channel members 26 above the substrate 27. The number of channel members 26 in each GAA device may be in a range of 2 to 10. Each of the channel members 26 includes silicon or another suitable semiconductor material. The channel members 26 of the GAA device 18 is wrapped around by a gate dielectric layer 28a, which may include an interfacial layer 30a and a high-k dielectric layer 32a. The channel members 26 of the GAA device 20 is wrapped around by a gate dielectric layer 28b, which may include an interfacial layer 30b and a high-k dielectric layer 32b. The channel members 26 of the GAA device 24 is wrapped around by a gate dielectric layer 28c, which may include an interfacial layer 30c and a high-k dielectric layer 32c. Gate electrodes (not shown) wrap around or over each of the gate dielectric layers 28a, 28b, and 28c. The gate electrode may include one or more work function metal layers and a bulk metal layer. In this embodiment, the GAA devices 18 and 20 share the same gate electrode, and the GAA device 24 has a separate gate electrode.

The GAA devices 18, 20, and 24 have varying gate dielectric layer thicknesses. For example, the GAA device 24 in the I/O area 14 includes a gate dielectric layer 28c of a first thickness (a capacitance equivalent thickness (CET)), which is the thickest gate dielectric layer suiting high voltage application; the GAA device 20 in the core area 12 includes a gate dielectric layer 28b of a second thickness, which is a medium thickness (a medium CET) suiting low-power and low-leakage application; the GAA device 18 in the core area 12 includes a gate dielectric layer 28a of a third thickness, which is the thinnest gate dielectric layer (a thinnest CET) suiting high-speed application. Accordingly, the IC 10 may be referred to as a tri-gate transistor device. To further the embodiment, within gate dielectric layers 28a, 28b, and 28c, the high-k dielectric layers 32a, 32b, and 32c may have substantially the same physical thickness (e.g., from about 20 Å to about 100 Å), while the interfacial layers 30a, 30b, and 30c have varying physical thicknesses. As an example, the interfacial layer 30b may be about 10% to about 20% thicker than the interfacial layer 30a. If the interfacial layer 30b is less than 10% thicker than the interfacial layer 30a, the leakage issue may start to degrade circuit performance; if the interfacial layer 30b is larger than 20% thicker than the interfacial layer 30a, the speed of the core device may be slowed down too much. The interfacial layer 30c may have a thickness that is from about 2 times to about 4 times of that of the interfacial layer 30a. If the thickness of the interfacial layer 30c is less than about 2 times of that of the interfacial layer 30a, the high voltage performance will be degraded; if the thickness of the interfacial layer 30c is larger than 4 times of that of the interfacial layer 30a, the gate drive capability of the I/O device becomes weak due to large oxide thickness. In a particular example, the interfacial layer 30a has a thickness ranging from about 5 Å (Angstrom) to about 20 Å, the interfacial layer 30b has a thickness that has a ratio about 1.1:1 to about 1.2:1 of the thickness of the interfacial layer 30a, and the interfacial layer 30c has a thickness ranging from about 20 Å and about 40 Å.

Figure 2A:
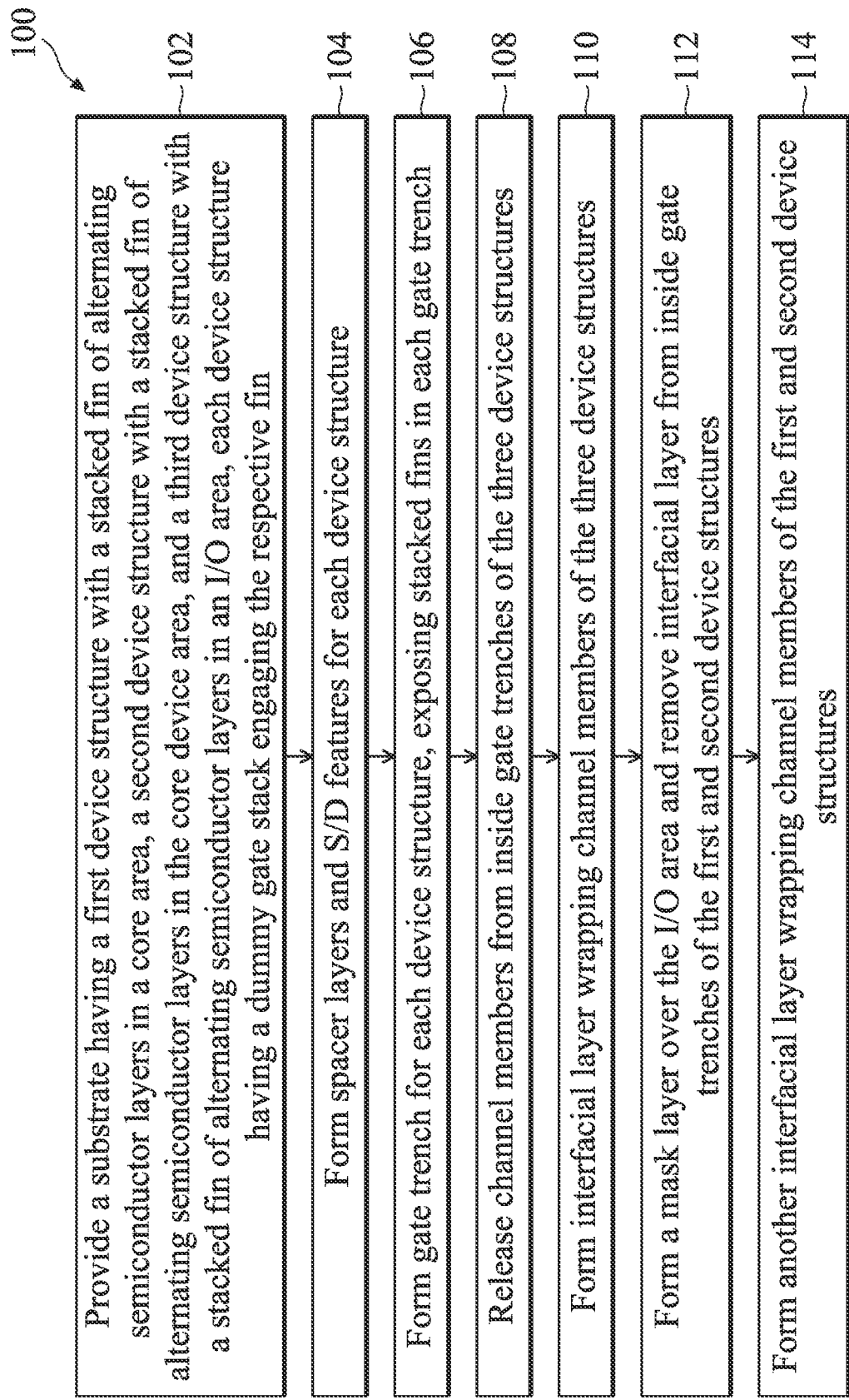
FIGS. 2A and 2B show a flow chart of a method for forming the devices shown in FIGS. 1A-B, according to aspects of the present disclosure.
Figure 2B:
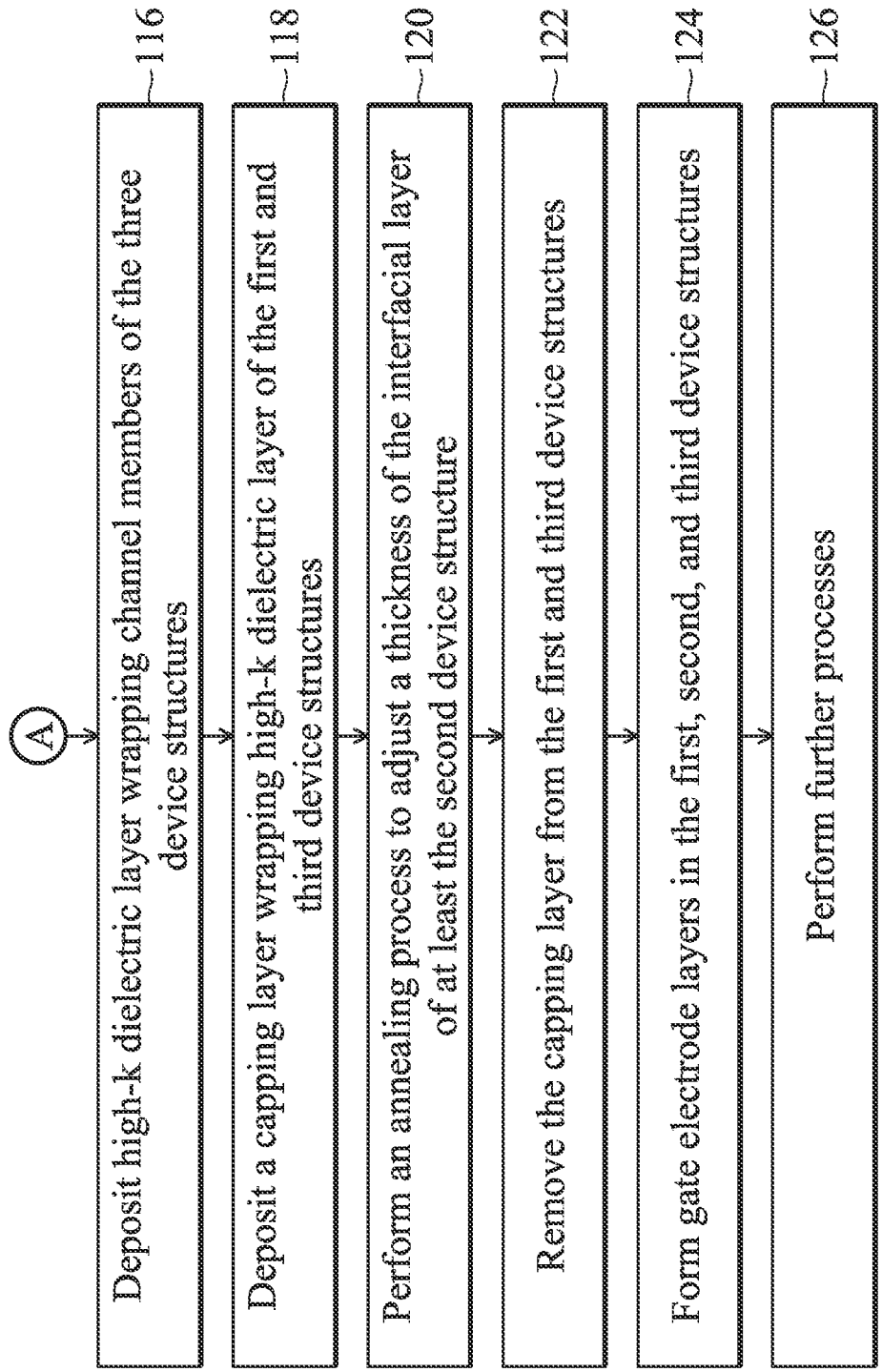

FIGS. 2A and 2B illustrate a flow chart of a method 100 for forming a tri-gate transistor device according to various aspects of the present disclosure. FIGS. 2A and 2B will be described below in conjunction with FIGS. 3-17, which are fragmentary cross-sectional views of a workpiece at various stages of fabrication according to method 100. The method 100 is merely an example, and is not intended to limit the present disclosure beyond what is explicitly recited in the claims. Additional steps can be provided before, during, and after method 100, and some of the steps described can be moved, replaced, or eliminated for additional embodiments of method 100. Additional features can be added in the semiconductor device depicted in FIGS. 3-17 and some of the features described below can be replaced, modified, or eliminated in other embodiments of the semiconductor device.

Figure 3:
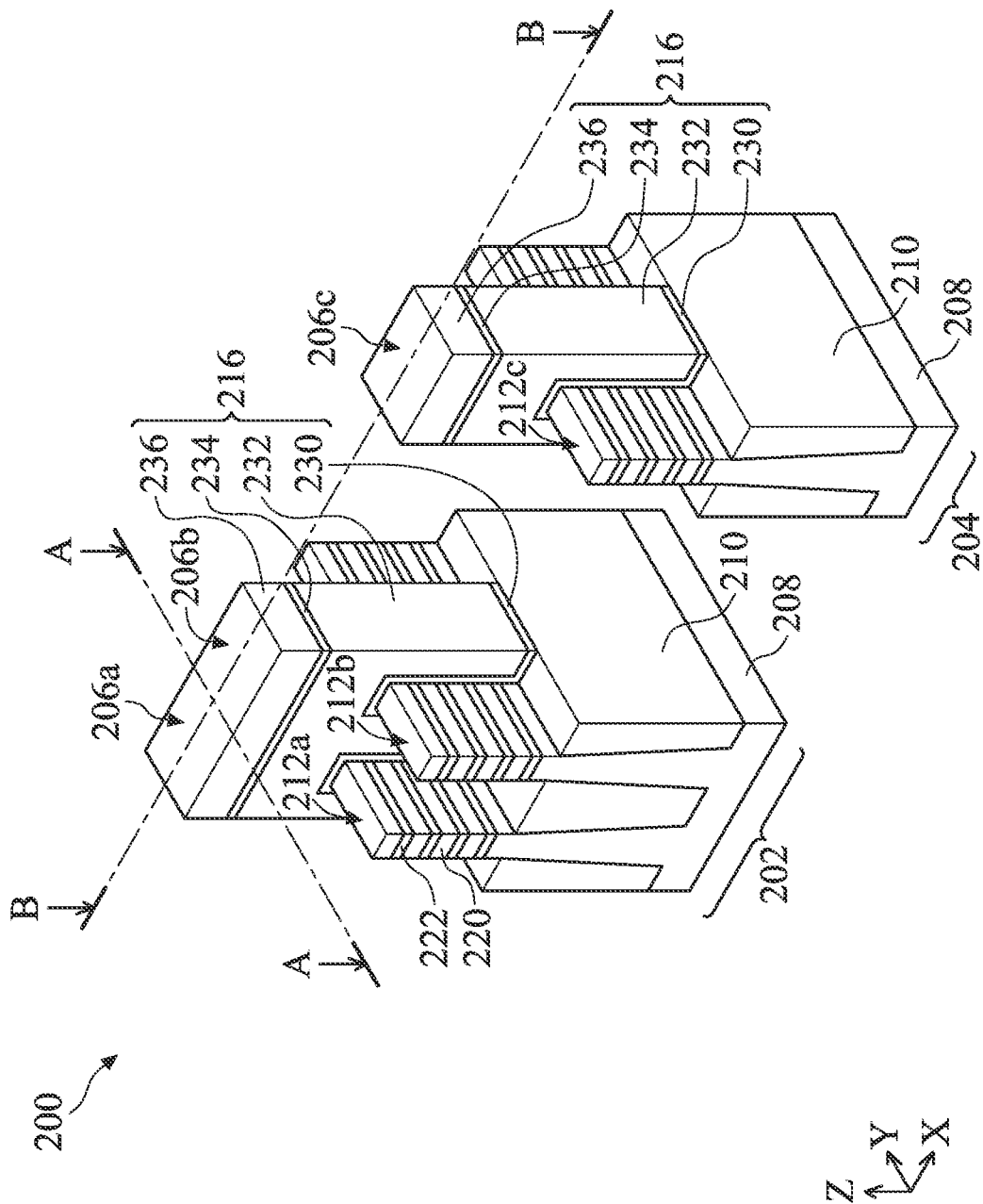
FIG. 3 shows a diagrammatic perspective view of a semiconductor device, according to aspects of the present disclosure.

At operation 102, the method 100 (FIG. 2A) provides a semiconductor structure 200 (or semiconductor device 200) that includes a first area 202 and a second area 204, as shown in FIG. 3. Each of the areas 202 and 204 includes device regions that include transistors serving different functions. In some embodiments, the first area 202 is a core area and the second area 204 is an input/output (I/O) area. In those embodiments, a core area refers to a device area that includes logic cells, such as inverter, NAND, NOR, AND, OR, and Flip-Flop, as well as memory cells, such as static random access memory (SRAM), dynamic random access memory (DRAM), and Flash. An I/O area refers to a device area that interfaces between a core device area and external/peripheral circuitry, such as the circuit on the printed circuit board (PCB) on which the semiconductor device 200 is mounted. In the illustrated embodiment, the core area 202 includes a GAA core device structure 206a for high-speed application and a GAA core device structure 206b for low-power and low-leakage application; the I/O area 204 includes a GAA I/O device structure 206c for I/O or ESD application.

Each of the device structures 206a, 206b, and 206c includes the substrate 208, the isolation structure 210, the fin 212a, 212b, or 212c that comprises alternating semiconductor layers 220 and 222 vertically stacked (also refer to as stacked fin 212a, 212b, or 212c), and a dummy gate structure 216 engaging either the stacked fin 212a, 212b, or 212c.

In some embodiments, the substrate 208 includes silicon. Alternatively or additionally, substrate 208 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. In some implementations, the substrate 208 includes one or more group III-V materials, one or more group II-IV materials, or combinations thereof. In some implementations, the substrate 208 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. The substrate 208 can include various doped regions configured according to design requirements of semiconductor device 200. P-type doped regions may include p-type dopants, such as boron, indium, other p-type dopant, or combinations thereof. N-type doped regions may include n-type dopants, such as phosphorus, arsenic, other n-type dopant, or combinations thereof. In some implementations, the substrate 208 includes doped regions formed with a combination of p-type dopants and n-type dopants. The various doped regions can be formed directly on and/or in substrate 208, for example, providing a p-well structure, an n-well structure, a dual-well structure, a raised structure, or combinations thereof. An ion implantation process, a diffusion process, and/or other suitable doping process can be performed to form the various doped regions. In some embodiments, p-type GAA devices and p-type FinFET devices are formed over n-type wells, while n-type GAA devices and n-type FinFET devices are formed over p-type wells. Each of the device structures 206a, 206b, and 206c may individually be an n-type or a p-type device.

The isolation structure 210 may comprise silicon oxide, silicon nitride, silicon oxynitride, fluoride-doped silicate glass (FSG), a low-k dielectric material, and/or other suitable insulating material. The isolation structure 210 may be shallow trench isolation (STI) features. Other isolation structure such as field oxide, LOCal Oxidation of Silicon (LOCOS), and/or other suitable structures are possible. The isolation structure 210 may include a multi-layer structure, for example, having one or more thermal oxide liner layers.

Each of the stacked fins 212a, 212b, and 212c has the semiconductor layers 220 and 222 alternately stacked. The first semiconductor material in the semiconductor layers 220 is different from the second semiconductor material in the semiconductor layers 222, in material and/or composition. Each of the first semiconductor material and the second semiconductor material may include silicon, germanium, a compound semiconductor including silicon carbide, gallium arsenic, gallium phosphide, indium phosphide, indium arsenide, and indium antimonide, or an alloy semiconductor including SiGe, GaAsP, AlInAs, AlGaAs, GaInAs, GaInP, and GaInAsP. In the present embodiment, the semiconductor layers 220 comprise silicon, and the semiconductor layers 222 comprise germanium or silicon germanium alloy. The semiconductor layers 220 and 222 in the stacked fins 212a and 212b may additionally include dopants (e.g., phosphorus, arsenic, boron, and/or indium) for improving the performance of the GAA transistor to be formed.

The stacked fins 212a, 212b, and 212c can be formed by epitaxially growing the semiconductor layers 220 and 222 over the substrate 208 and then patterned by any suitable method to form the individual stack fins 212a, 212b, and 212c. For example, the stacked fins 212a, 212b, and 212c may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the stacked fins 212a, 212b, and 212c by etching the initial semiconductor layers 220, 222 and the substrate 208. The etching process can include dry etching, wet etching, reactive ion etching (RIE), and/or other suitable processes. In the illustrated embodiment, stacked fins 212a, 212b, and 212c extend lengthwise in the same direction (longitudinal axes are parallel). In some embodiments, the stacked fins 212a and 212b in the core area 202 extend lengthwise in the same direction (e.g., along y-direction), while the stack fin 212c in the I/O area 204 may extend lengthwise in a different direction, such as in a perpendicular direction (e.g., along x-direction) or other directions.

The dummy gate structure 216 reserves an area for a metal gate stack and includes a dummy interfacial layer 230, a dummy gate electrode 232, a first gate hard mask layer 234, and a second gate hard mask layer 236. The dummy interfacial layer 230 is formed over top and sidewall surfaces of each of the stacked fins 212a, 212b, and 212c and over the top surface of the isolation structure 210. The dummy interfacial layer 230 may include a dielectric material such as an oxide layer (e.g., SiO2) or oxynitride layer (e.g., SiON), and may be deposited by chemical oxidation, thermal oxidation, atomic layer deposition (ALD), chemical vapor deposition (CVD), and/or other suitable methods.

The dummy gate electrode 232 may include poly-crystalline silicon (poly-Si) and may be formed by suitable deposition processes such as low-pressure chemical vapor deposition (LPCVD) and plasma-enhanced CVD (PECVD). Each of the gate hard mask layers 234 and 236 may include one or more layers of dielectric material such as silicon oxide and/or silicon nitride, and may be formed by CVD or other suitable methods. For example, the first gate hard mask layer 234 may include a silicon oxide layer adjacent the dummy gate electrode 232 and the second gate hard mask layer 236 may include a silicon nitride layer. The various layers 230, 232, 234, and 236 may be patterned by photolithography and etching processes.

Figure 4:
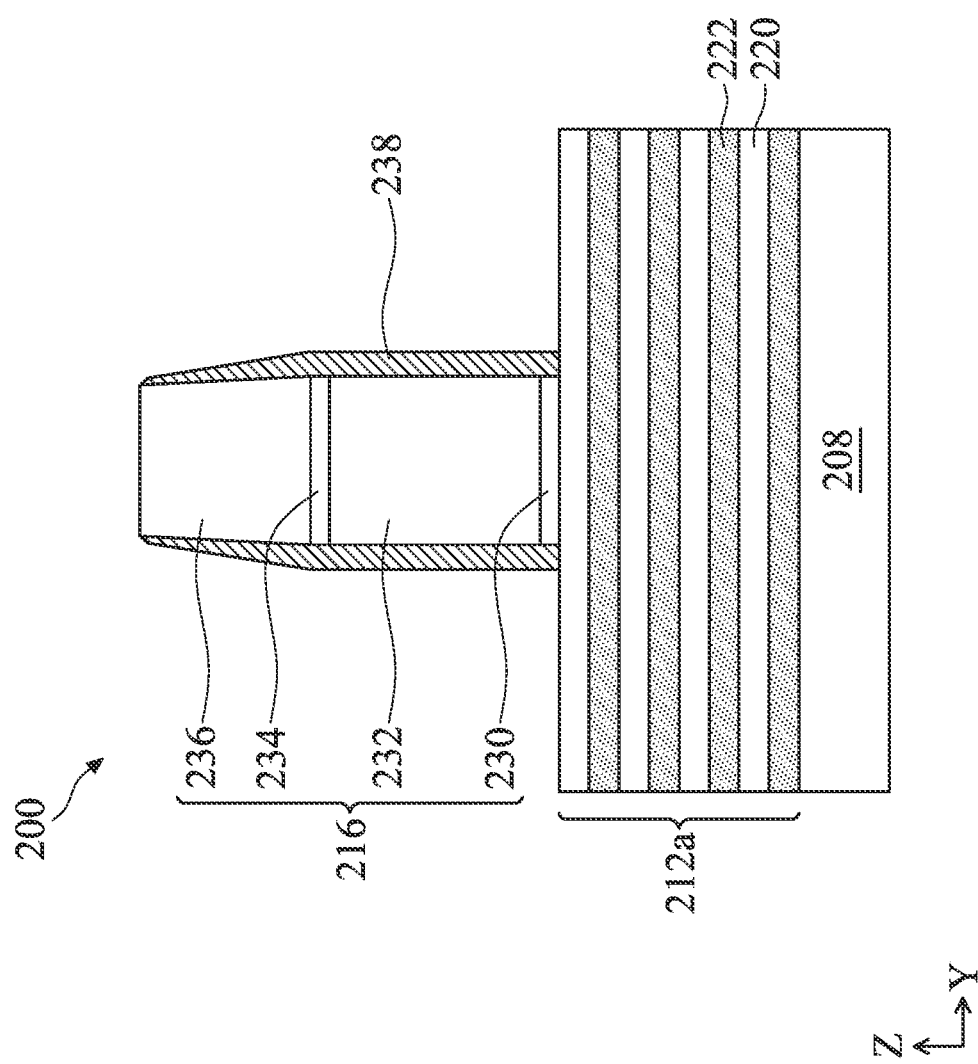
FIGS. 4, 5, 6, 7, 8, 9, 10, 11, 12, 13, 14, 15, 16, 17, and 18 illustrate cross-sectional views of a semiconductor structure during fabrication processes according to the method of FIGS. 2A and 2B, in accordance with various embodiments of the present disclosure.
Figure 5:
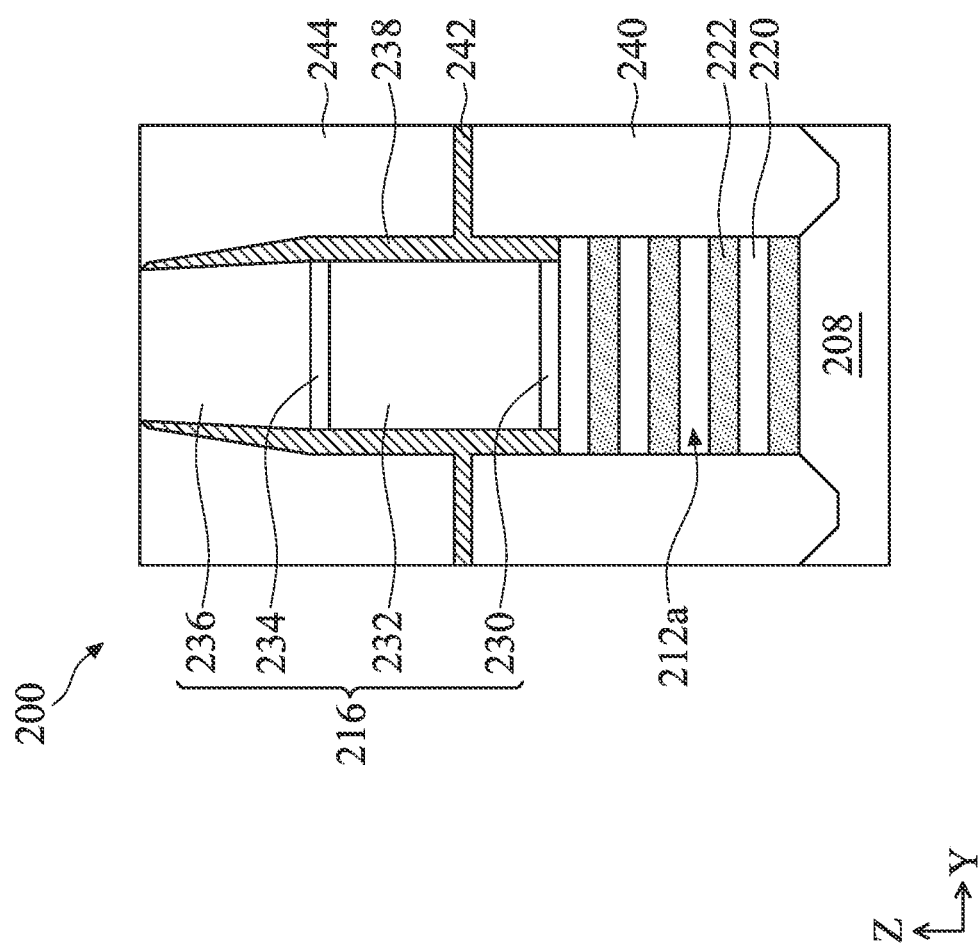
Figure 6:
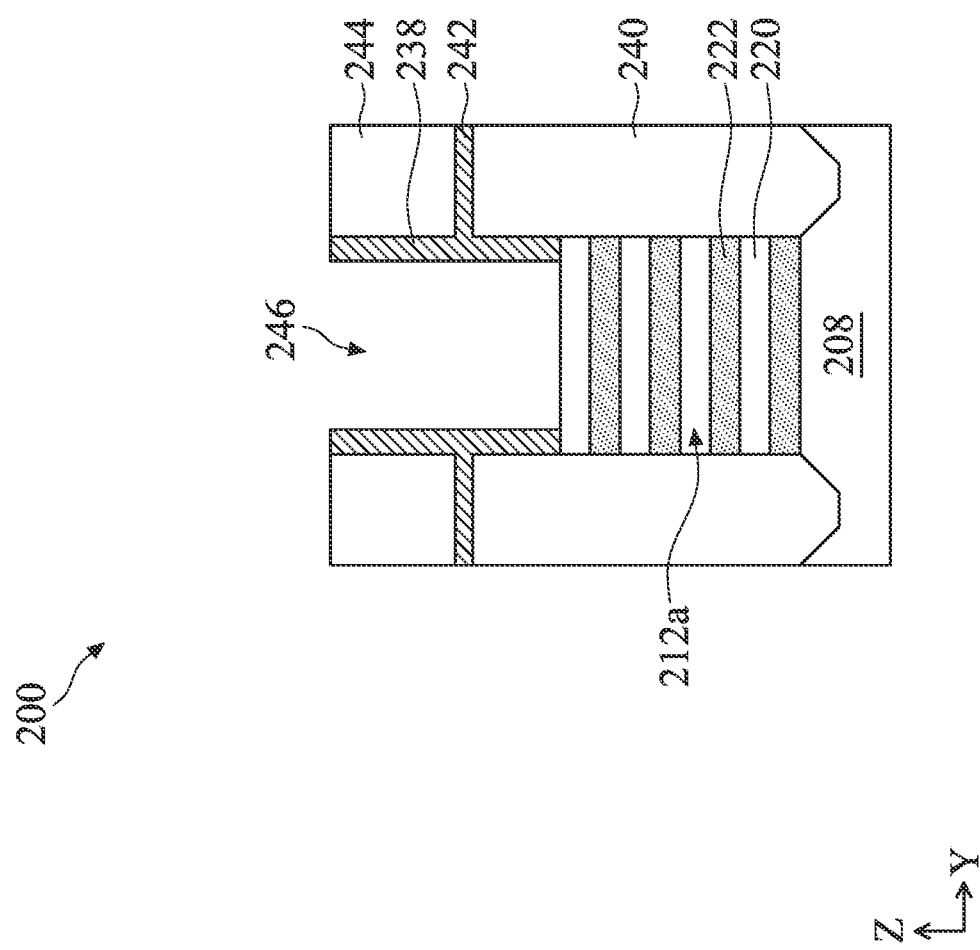

For clarity of description and illustration, FIGS. 4-6 include fragmentary cross-sectional views of the GAA core device structure 206a along the section A-A shown in FIG. 3, which passes the respective channel region along the lengthwise direction of the stacked fin 212a (in Y-Z plane). Cross-sectional views of the GAA core device structure 206b and GAA I/O device structure 206c in Y-Z plane are similar to what is illustrated in FIGS. 4-6 and omitted for simplicity. FIGS. 7-18 include fragmentary cross-sectional views of the semiconductor device 200 along the section B-B shown in FIG. 3, which passes multiple channel regions along a direction perpendicular to the lengthwise direction of the stacked fins 212a, 212b, and 212c (in X-Z plane).

At operation 104, the method 100 (FIG. 2A) forms the gate spacers 238 over the sidewalls of the dummy gate structure 216, as shown in FIG. 4. The gate spacers 238 may comprise a dielectric material, such as silicon oxide, silicon nitride, silicon oxynitride, silicon carbide, other dielectric material, or combinations thereof, and may comprise one or multiple layers of material. The gate spacers 238 may be formed by depositing a spacer material as a blanket over the semiconductor device 200. Then the spacer material is etched by an anisotropic etching process. Portions of the spacer material on the sidewalls of the dummy gate structure 216 become the gate spacers 238. Operation 104 further forms S/D features 240 in the S/D regions, as shown in FIG. 5. For example, operations 104 may etch recesses into the stacked fins 212a, 212b, and 212c, and epitaxially grow semiconductor materials in the recesses. The semiconductor materials may be raised above the top surface of the respective fins. Operation 104 may form the S/D features 240 separately for n-type and p-type devices. For example, Operation 104 may form the S/D features 240 with an n-type doped silicon for n-type devices, and with a p-type doped silicon germanium for p-type devices. Operation 104 may further form contact etch stop (CESL) layer 242 over the S/D features 240 and inter-layer dielectric (ILD) layer 244 over the CESL layer 242. The CESL layer 242 may comprise silicon nitride, silicon oxynitride, silicon nitride with oxygen (O) or carbon (C) elements, and/or other materials; and may be formed by CVD, PVD (physical vapor deposition), ALD, or other suitable methods. The ILD layer 244 may comprise tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 244 may be formed by PECVD or FCVD (flowable CVD), or other suitable methods. A CMP process may follow operation 104 to remove excessive dielectric materials. In some embodiments, the CMP process also removes the gate hard masks 234 and 236 and exposes the dummy gate electrode 232.

Figure 7:
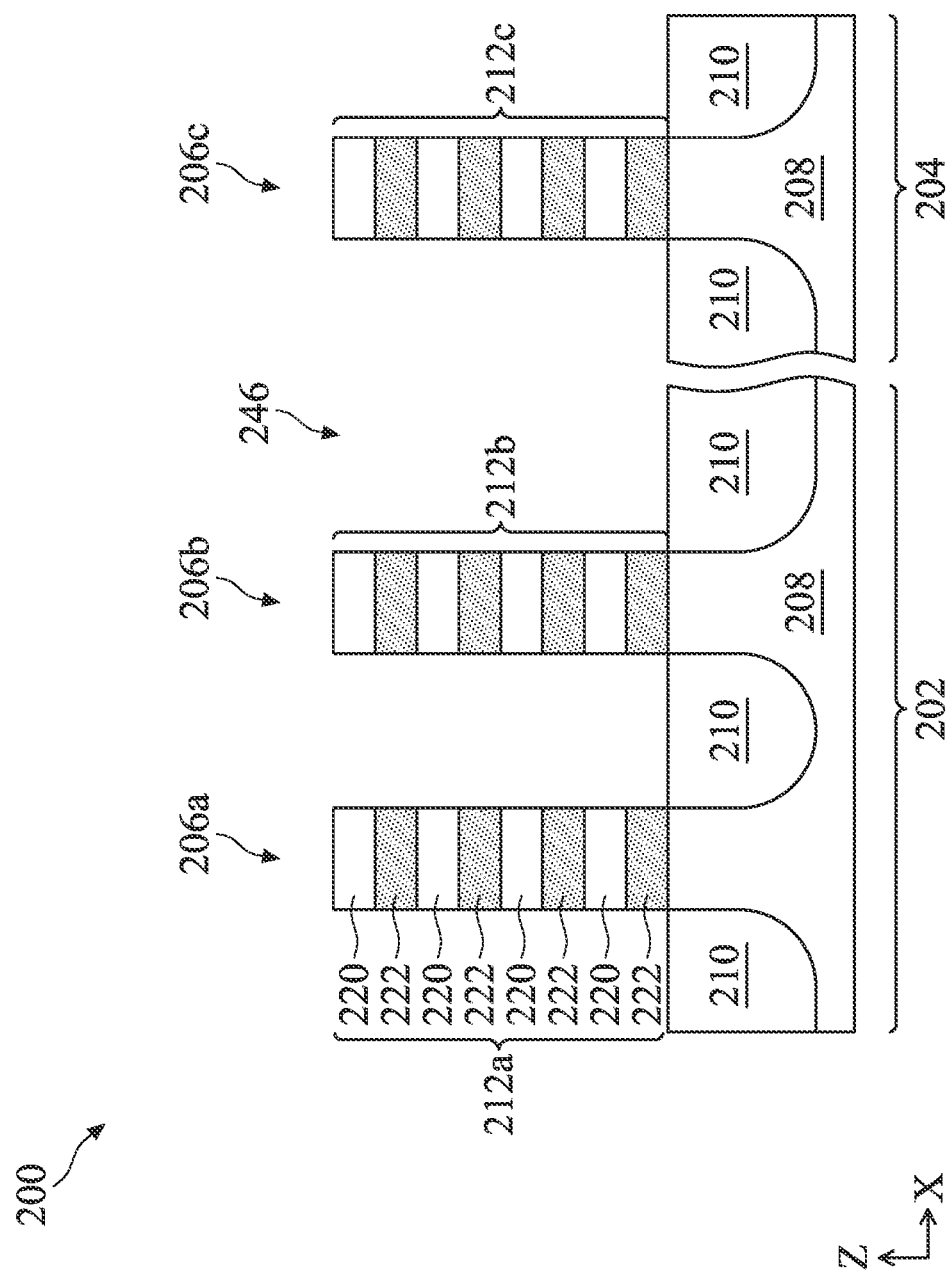

At operation 106, the method 100 (FIG. 2A) removes the dummy gate electrode 232, resulting in gate trenches 246, as shown in FIG. 6. Operation 106 may include one or more etching processes that are selective to the material in the dummy gate electrode 232. By selecting an etchant that resists etching the gate spacers 238 and ILD layer 244, portions of the gate spacers 238 and ILD layer 244 adjacent to the dummy gate electrode 232 are exposed in the gate trenches 246 without substantial etching loss. This may increase the tolerance of the photolithographic process. The etching process may include any suitable etching technique such as wet etching, dry etching, RIE, ashing, and/or other etching methods. In an example, the etching process is a dry etching process using a fluorine-based etchant (e.g., $CF_4$, $CHF_3$, $CH_2F_2$, etc.). Operation 106 includes removing the dummy interfacial layer 230 from the gate trenches 246, also as shown in FIG. 7.

Figure 8:
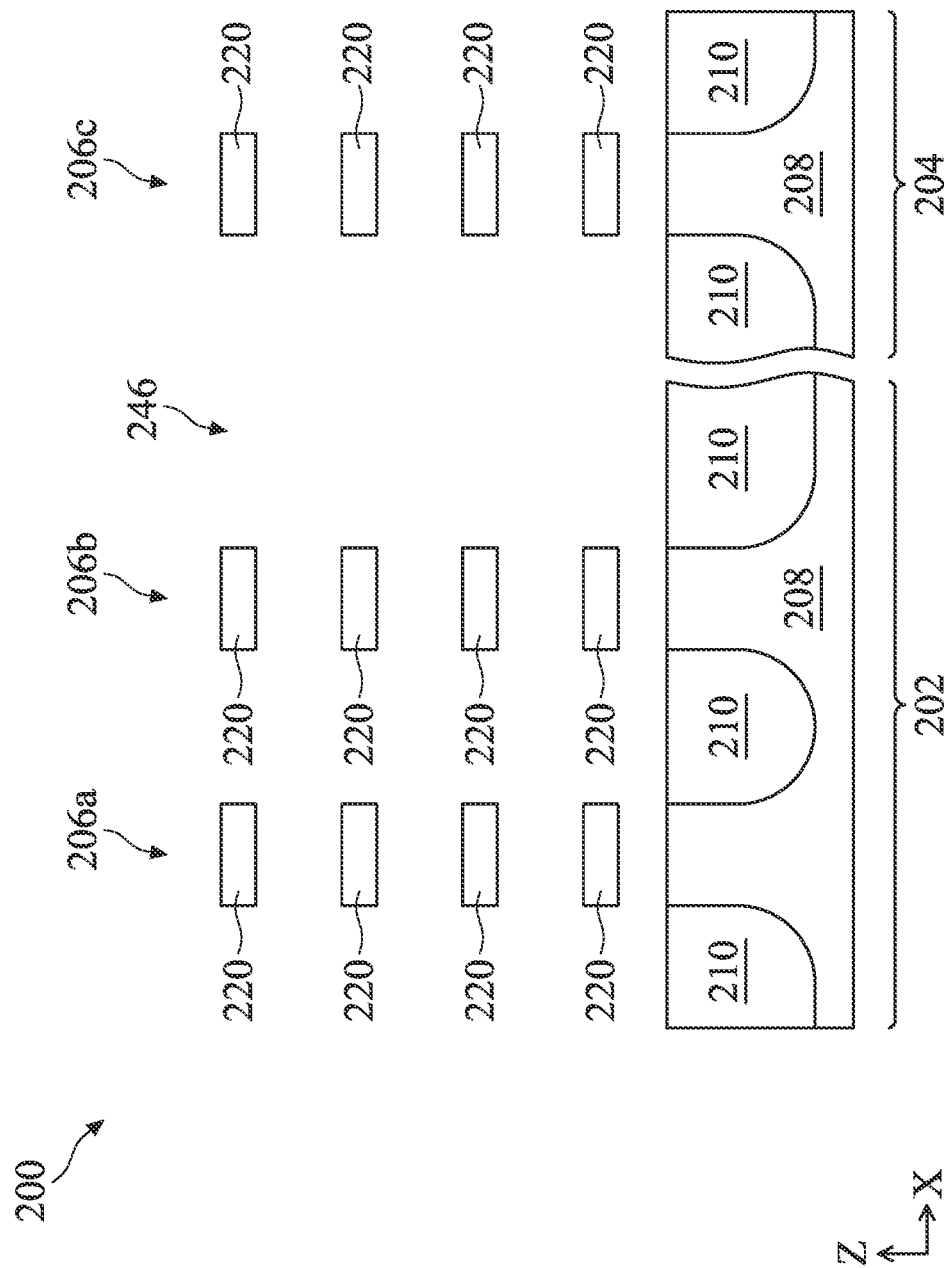
Figure 9:
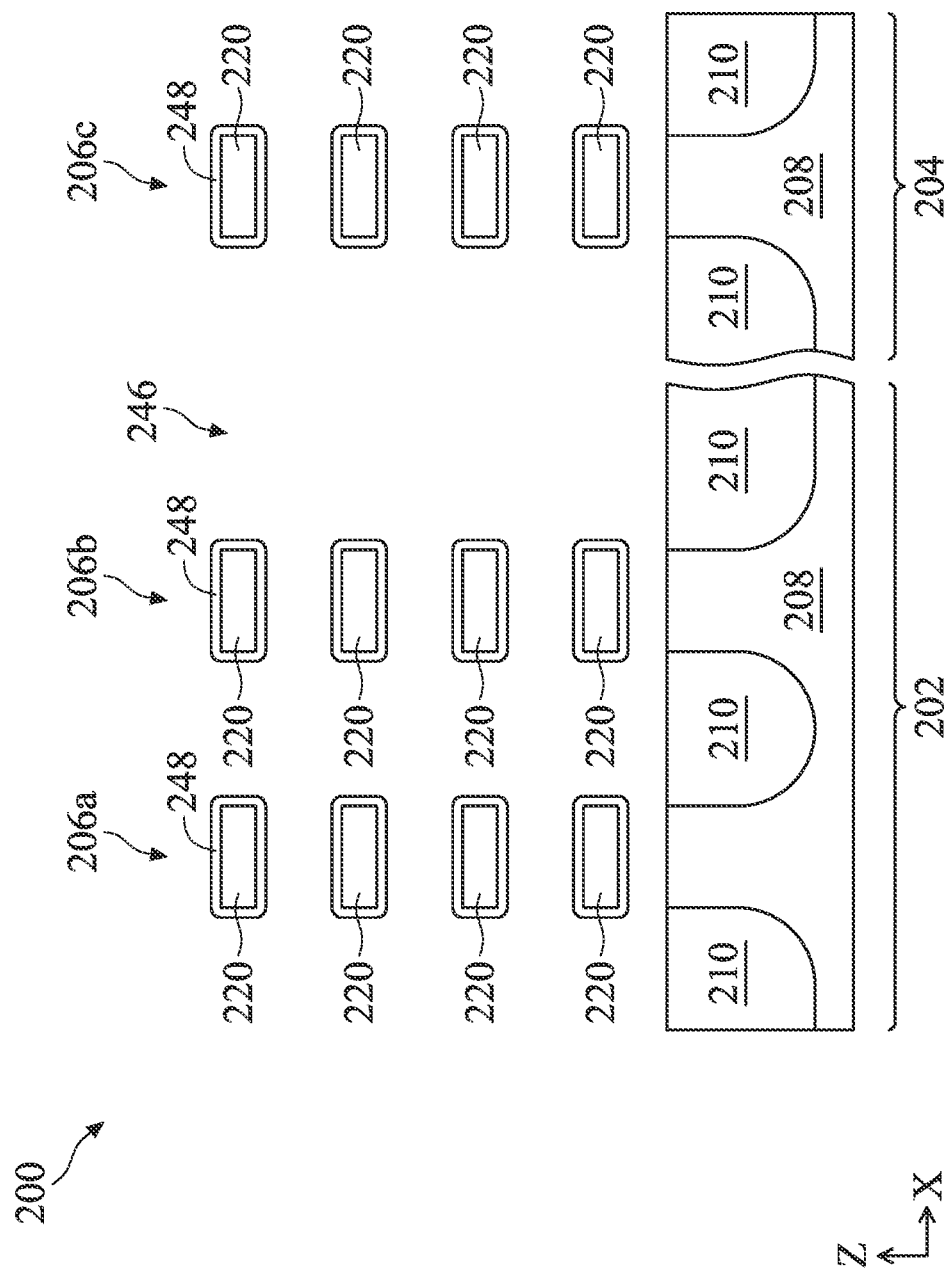

At operation 108, the method 100 (FIG. 2A) releases channel members in the channel regions of the GAA device structures 206a, 206b, and 206c from the gate trenches 246, as shown in FIG. 8. In the illustrated embodiment, channel members are nanowires. The term nanowire is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. For the sake of simplicity and clarity, the semiconductor layers 220 are denoted as nanowires 220 after operation 110. In the present embodiment, the semiconductor layers 220 include silicon, and the semiconductor layers 222 include silicon germanium. The plurality of semiconductor layers 222 may be selectively removed. In some implementations, the selectively removal process includes oxidizing the plurality of semiconductor layers 222 using a suitable oxidizer, such as ozone. Thereafter, the oxidized semiconductor layers 222 may be selectively removed. To further this embodiment, the operation 110 includes a dry etching process to selectively remove the semiconductor layers 222, for example, by applying an HCl gas at a temperature of 500° C. to 700° C., or applying a gas mixture of $CF_4$, $SF_6$, and $CHF_3$. At this point, as shown in FIG. 8, vertically stacked nanowires 220 are formed in the channel regions of the GAA core device structure 206a, 206b, and in the channel region of the GAA I/O device structure 206c. Although FIG. 9 illustrates four nanowires 220 for each stack, there may be less or more vertically stacked nanowires 220 in various embodiments. For example, the number of nanowires 220 in each GAA device structure may be in a range of 2 to 10.

At operation 110, the method 100 (FIG. 2A) forms interfacial layer 248 wrapping all the nanowires 220 in the GAA device structures 206a, 206b, and 206c. The interfacial layer 248 may include a dielectric material such as an oxide layer (e.g., $SiO_2$) or oxynitride layer (e.g., SiON), and may be deposited by chemical oxidation, thermal oxidation, atomic layer deposition (ALD), chemical vapor deposition (CVD), and/or other suitable methods. The interfacial layer 230 has a thickness suitable for I/O applications, such as a thickness ranging from about 20 Å and about 40 Å. In the illustrate embodiment, the interfacial layer 248 is a silicon dioxide layer deposited in a plasma enhanced atomic layer deposition (PEALD) process, which is suitable to grow relatively thicker oxide layer. The PEALD process may apply a plasma containing 02 and Ar, under a temperature ranging from about 200° C. to about 200° C., with an RF power ranging from about 500 W to about 700 W. After the deposition, the interfacial layer 248 may further go through a post oxide annealing (POA) process to improve gate oxide quality. As to be shown later on, the interfacial layer 248 remains on the nanowires 220 in the GAA I/O device structure 206c as an I/O oxide layer, while other portions of the interfacial layer 248 will be removed from other nanowires 220 in the GAA core device structures 206a and 206b.

Figure 10:
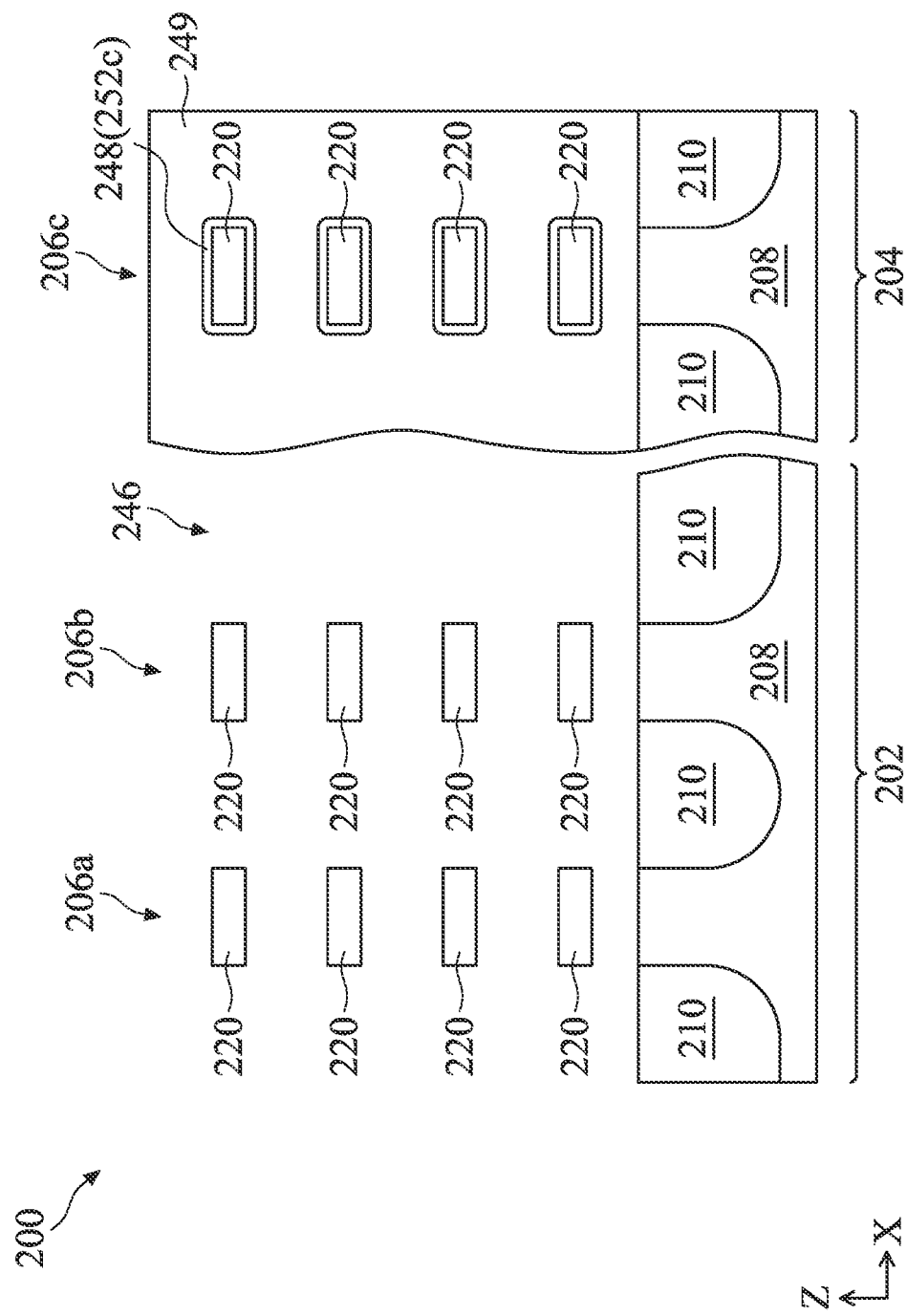

At operation 112, the method 100 (FIG. 2A) forms a mask layer 249 over the I/O area and removes the interfacial layer 248 from the nanowires 220 in the GAA core device structures 206a and 206b, as shown in FIG. 10. The interfacial layer 248 may be removed, for example, by wet etching, dry etching, reactive ion etching, or other suitable etching methods. For example, the operation 108 may apply HF-based wet etchant(s) for wet etching or $NH_3$ and $H_2$ mixture for dry etching. During this operation, the mask layer 249 covers the portion of the interfacial layer 248 in the GAA I/O device structure 206c. The remaining portion of the interfacial layer 248 is denoted as interfacial layer 252c in the following discussion. In some embodiments, the mask layer 249 is a photoresist layer, such as a bottom antireflective coating (BARC) layer.

Figure 11:
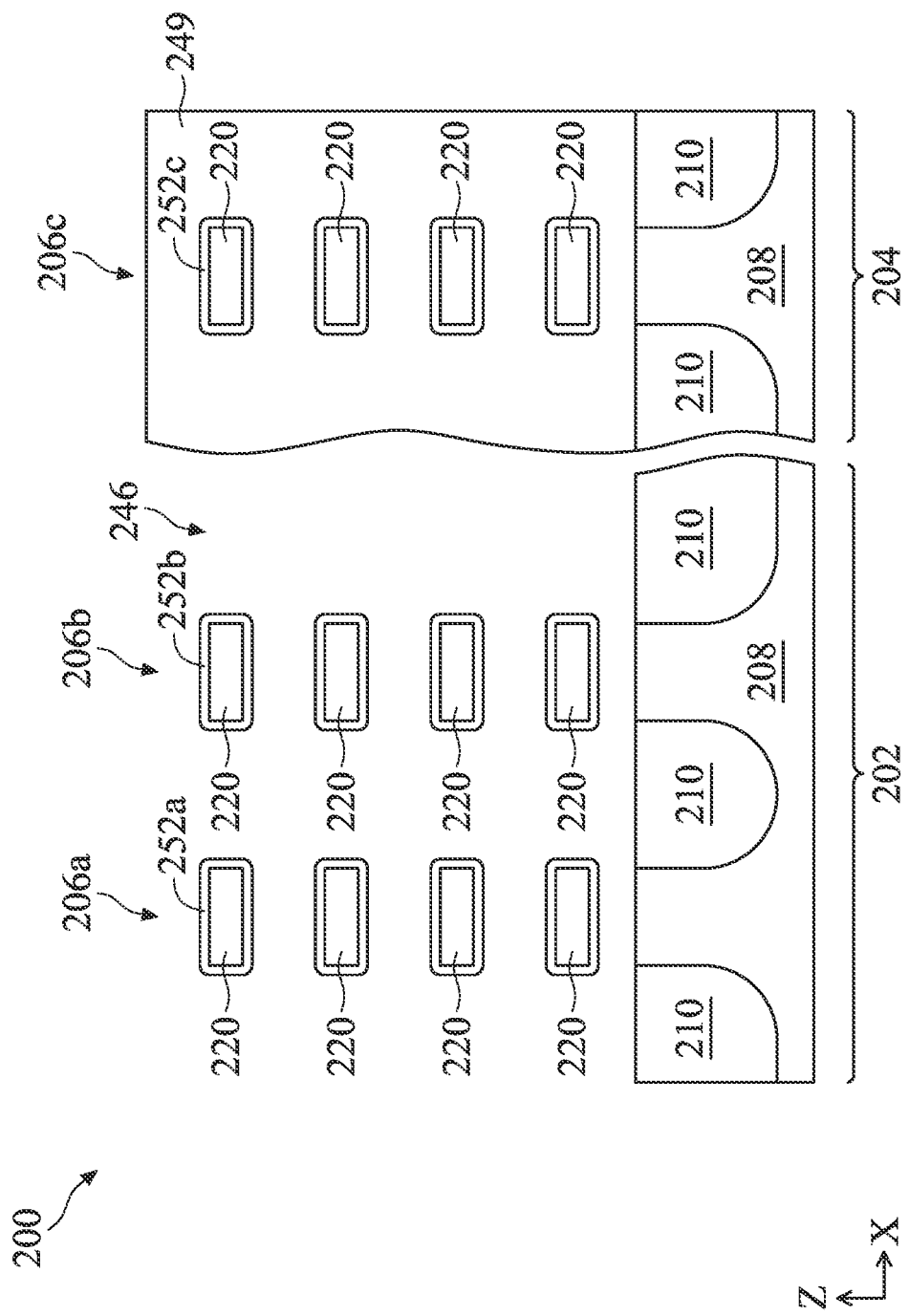

At operation 114, the method 100 forms another interfacial layer wrapping the nanowires 220 in the GAA core device structures 206a and 206b, as shown in FIG. 11. The interfacial layer 252a wraps the nanowires 220 in the GAA core device structure 206a and the interfacial layer 252b wraps the nanowires 220 in the GAA core device structure 206b. The interfacial layers 252a and 252b may include a dielectric material such as an oxide layer (e.g., $SiO_2$) or oxynitride layer (e.g., SiON), and may be deposited by chemical oxidation, thermal oxidation, atomic layer deposition (ALD), chemical vapor deposition (CVD), and/or other suitable methods. In some embodiments, each of the interfacial layer 252a and 252b may have a thickness suitable for high-speed application, such as a thickness ranging from about 5 Å and about 20 Å. In some embodiments, the interfacial layers 252a and 252b are grown in a process different from the process for forming the interfacial layer 252c. In the illustrated embodiment, the interfacial layers 252a and 252b are silicon dioxide layers formed in a $H_2O_2$-containing solution, such as SC1, SC2, and SPM. The mask layer 249 protects the interfacial layer 252c from thickness changes during operation 114. After operation 114, the mask layer 249 may be removed in an etching process, or other suitable processes, such as ashing or resist stripping.

Figure 12:
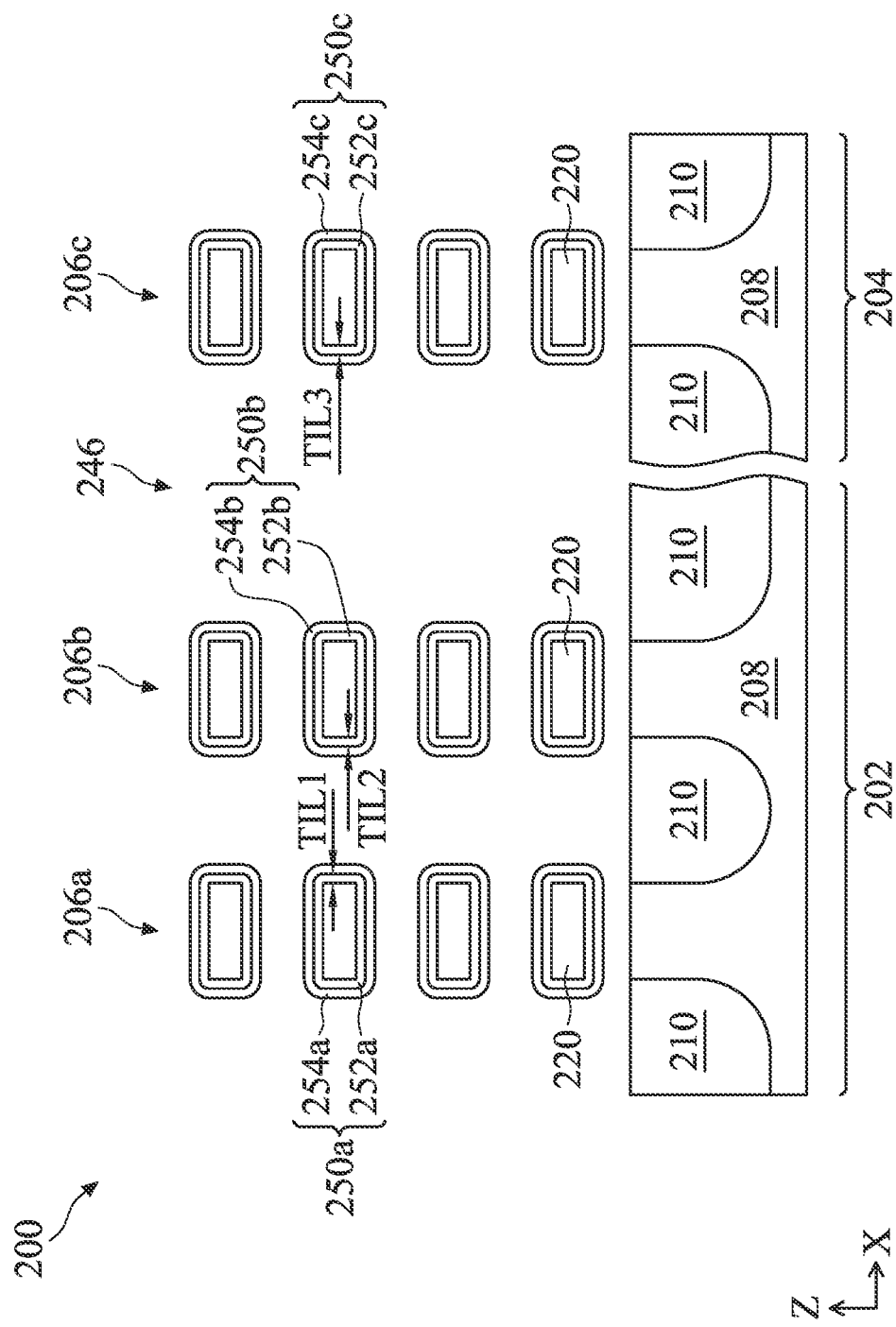

At operation 116, the method 100 (FIG. 2B) forms high-k dielectric layer 254 in the gate trenches 246, as shown in FIG. 12, thereby forming gate dielectric layers 250a, 250b, and 250c (collectively, gate dielectric layers 250) in channel regions of the GAA core device structure 206a, GAA core device structure 206b, and GAA I/O device structure 206c, respectively. The gate dielectric layer 250a includes the interfacial layer 252a wrapping nanowires 220 of the GAA core device structure 206a and a high-k dielectric layer 254a wrapping the interfacial layer 252a. The gate dielectric layer 250b includes an interfacial layer 252b wrapping nanowires 220 of the GAA core device structure 206b and a high-k dielectric layer 254b wrapping the interfacial layer 252b. The gate dielectric layer 250c includes an interfacial layer 252c wrapping nanowires 220 of the GAA I/O device structure 206c and a high-k dielectric layer 254c wrapping the interfacial layer 252c. The interfacial layers 252a, 252b, 252c and the high-k dielectric layers 254a, 254b, 254c are deposited as substantially conformal layers in the illustrated embodiment. Thicknesses of the high-k dielectric layers 254a, 254b, and 254c may be substantially the same. The high-k dielectric layer 254 may be deposited using any suitable technique, such as ALD, CVD, metal-organic CVD (MOCVD), PVD, thermal oxidation, combinations thereof, and/or other suitable techniques. The high-k dielectric layer 254 may include a metal oxide (e.g., LaO, AlO, ZrO, TiO, $Ta_2O_5$, $Y_2O_3$, $SrTiO_3$ (STO), $BaTiO_3$ (BTO), BaZrO, HfZrO, HfLaO, HfTaO, HfTiO, $(Ba,Sr)TiO_3$ (BST), $Al_2O_3$, etc.) a metal silicate (e.g., HfSiO, LaSiO, AlSiO, etc.), a metal or semiconductor nitride, a metal or semiconductor oxynitride, combinations thereof, and/or other suitable materials. In a specific example, the high-k dielectric layer 254 has a thickness ranging from about 30 Å to about 100 Å.

Figure 13:
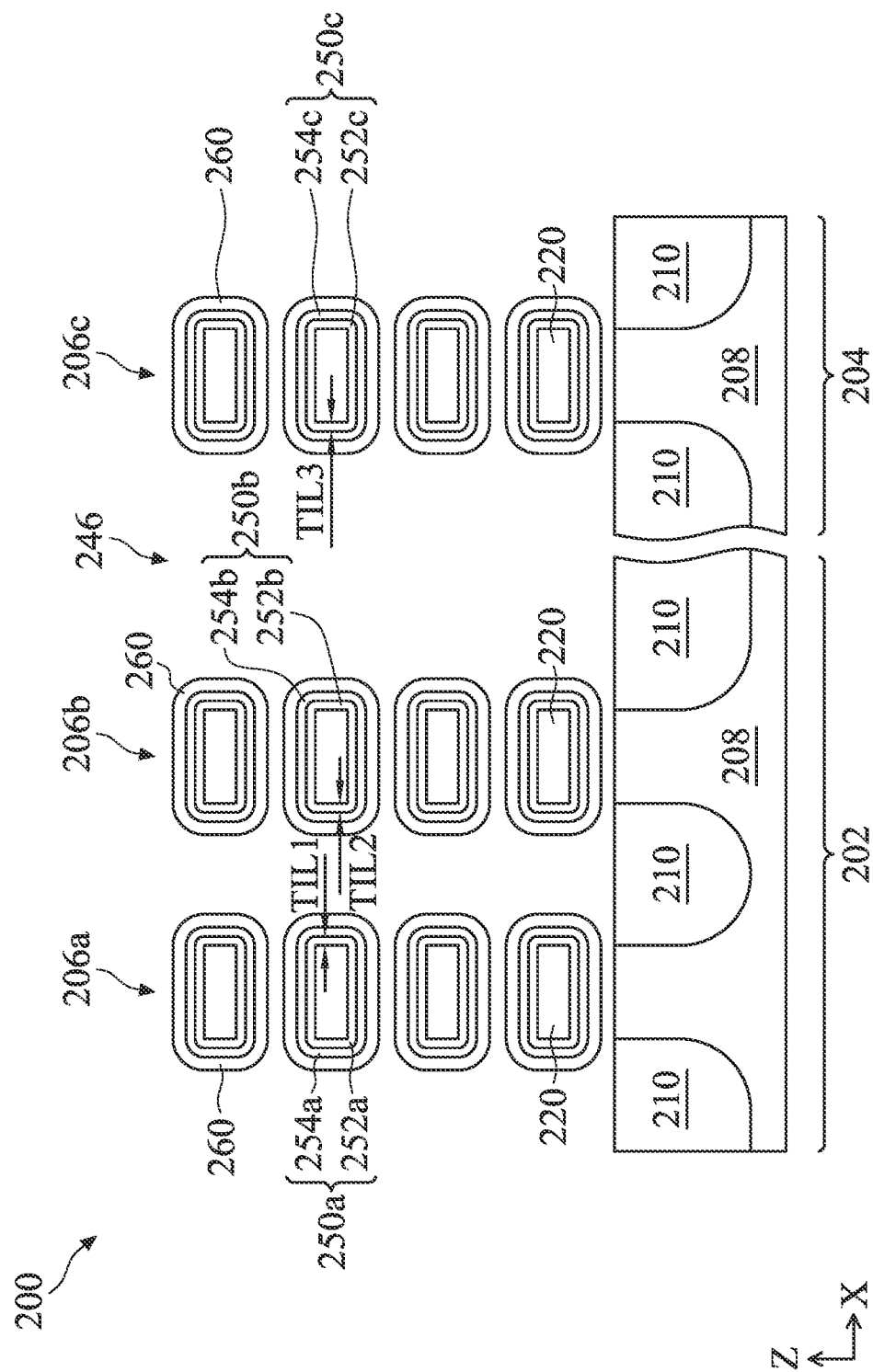
Figure 14:
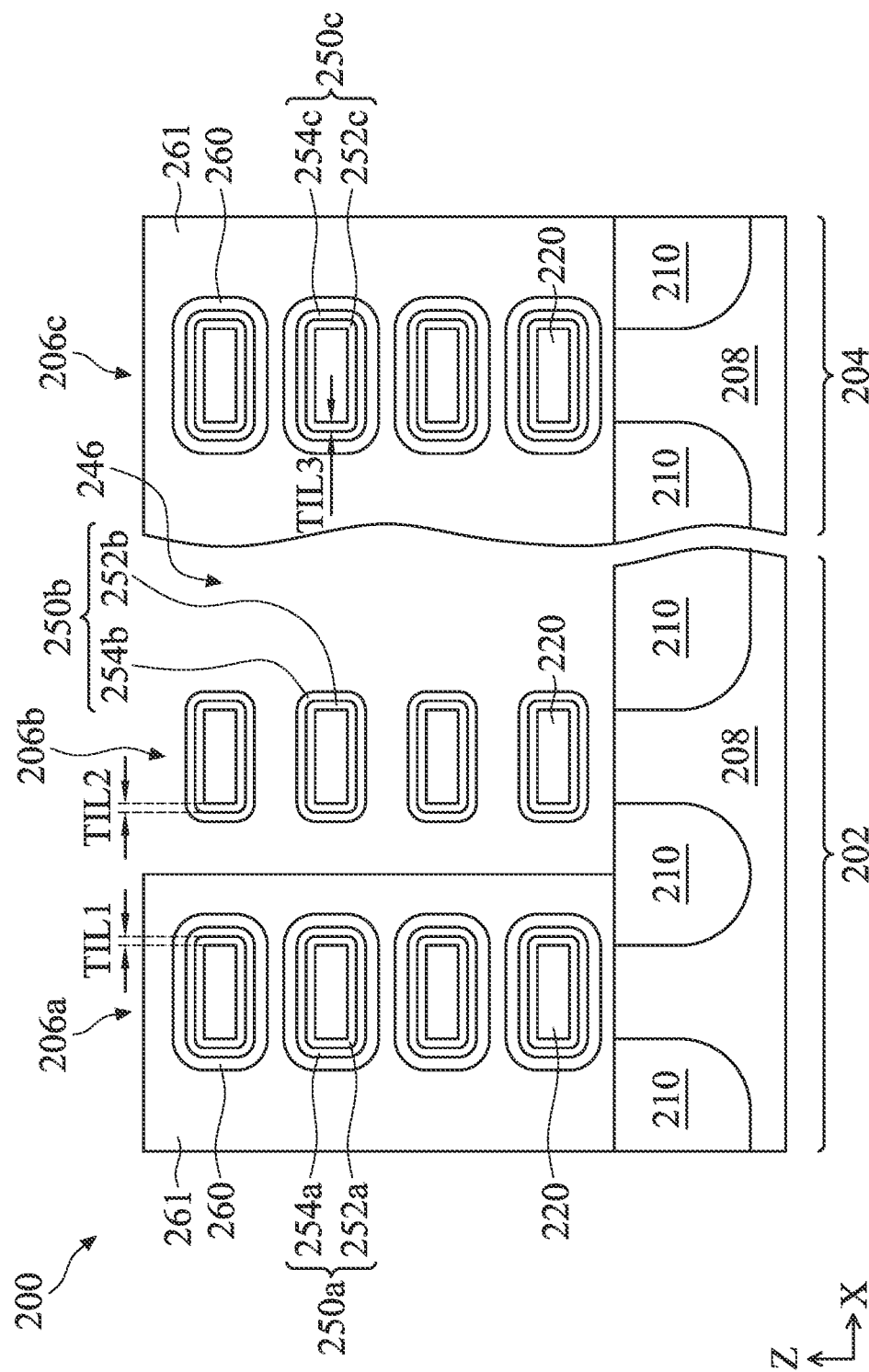
Figure 15:
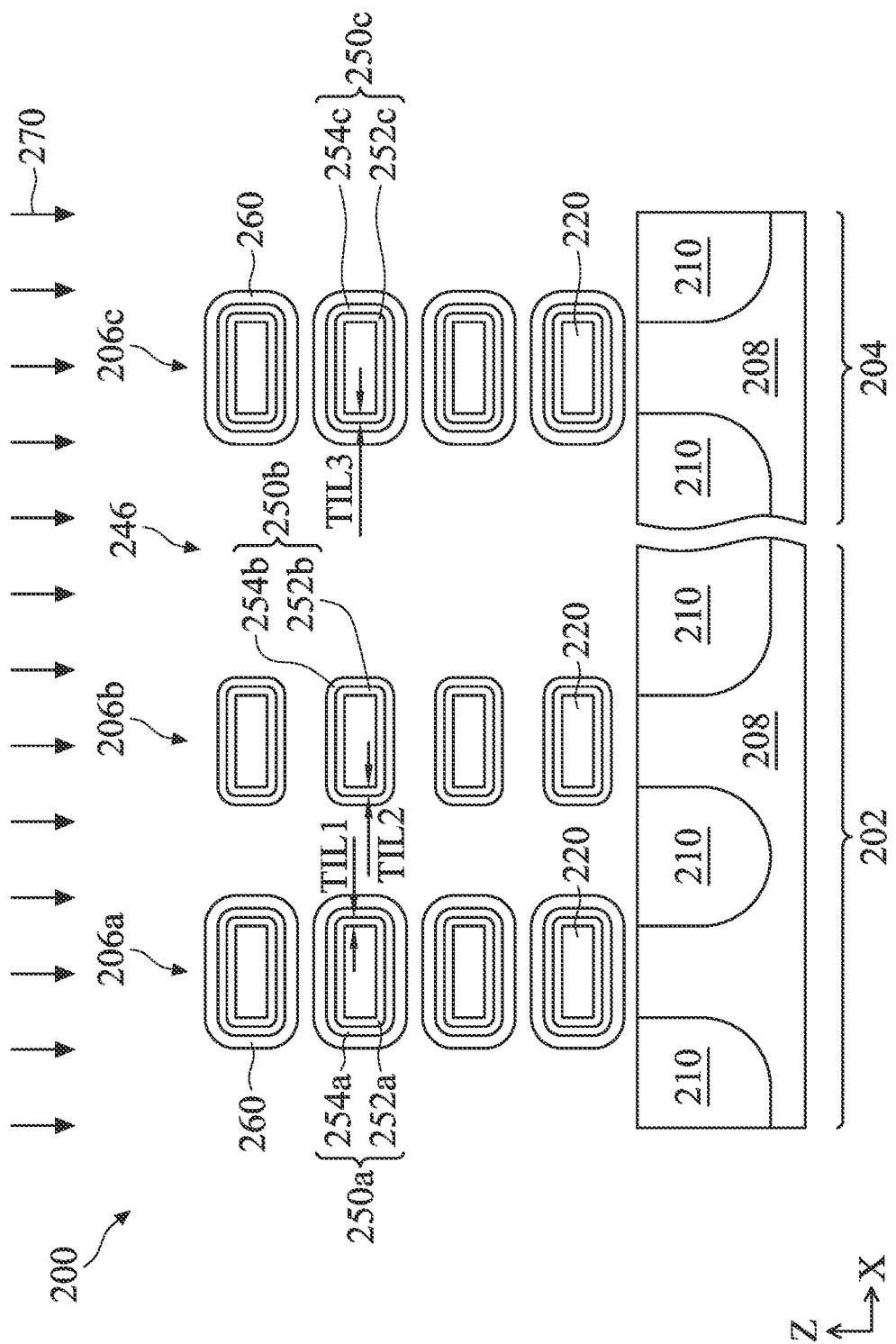

At operation 118, the method 100 (FIG. 2B) first forms a capping layer 260 wrapping the gate dielectric layers 250a, 250b, and 250c, as shown in FIG. 13. The thickness modulation layer 260 may include one or more material layers. In the illustrated embodiment, the thickness modulation layer 260 includes TiN. In furtherance of the embodiment, the capping layer 260 includes TiN that is metal rich, such as Ti:N ratio of about 1.05:1 or about 2:1. The deposition methods include physical vapor deposition, CVD, ALD, or other suitable methods. Subsequently, operation 120 forms a mask layer 261 covers the nanowires 220 of the GAA core device structure 206a and the GAA I/O device structure 206c, and removes the capping layer 260 from the GAA core device structure 206b, as shown in FIG. 14. The capping layer 260 may be removed, for example, by wet etching, dry etching, reactive ion etching, or other suitable etching methods. In some embodiments, the mask layer 261 is a photoresist layer, such as a bottom antireflective coating (BARC) layer. After operation 120, mask layer 261 may be removed, such as by etching, ashing, or resist stripping. At this point, the capping layer 260 remains only on the gate dielectric layer 250b of the GAA core device structure 206b.

At operation 120, the method 100 (FIG. 2B) performs an annealing process (represented by arrows 270 in FIG. 15) to initiate an oxide regrowth process on the interfacial layer 252b. The annealing process includes a spike annealing process having a nitrogen-containing ambient environment, with an initial temperature between about 500° C. and about 700° C., and a peak temperature between about 700° C. and about 900° C. In some embodiments, a thickness of the interfacial layer 252b may increase about 10% to about 20% by further silicon consumption. The capping layer 260 restricts the interfacial layers 252a and 252c from further growth by blocking oxygen from ambience. After operation 120, a thickness TIL2 of the interfacial layer 252b is larger than a thickness TIL2 of the interfacial layer 252a, but still smaller than a thickness TIL3 of the interfacial layer 252c. Since the annealing process is in a nitrogen-containing ambient environment, the high-k dielectric layer 254b may absorb nitrogen, resulting in a higher concentration of nitrogen in the high-k dielectric layer 254b than in the high-k dielectric layer 254a or 254c.

In some alternative embodiments of the method 100, the capping layer 260 is a thickness modulation layer, such as an oxygen-scavenging layer 260. The oxygen-scavenging layer 260 has a higher affinity for oxygen than the metal in the metal-oxide (in the high-k gate dielectric layer) and silicon (in the interfacial layer). The oxygen-scavenging layer 260 may include a metal or a metal compound such as Ti, Hf, Zr, Ta, Al, or combinations thereof such as TiAl. The oxygen-scavenging layer 260 may also be formed of a metal nitride (e.g. TaN, TaSiN, TiSiN), or a nitride of a metal alloy such as TiAlN. In some embodiments, the oxygen-scavenging layer 260 may be a silicon layer. In a specific example, the oxygen-scavenging layer 260 includes TiSiN that is metal rich (such as a Ti:N ratio of about 1.05:1 to about 2:1). The oxygen-scavenging layer 260 has the function of scavenging oxygen from interfacial layer 252a at elevated temperatures. At operation 120 in some alterative embodiments, the method 100 performs an annealing process (represented by arrows 271 in FIG. 16) to initiate and enable the oxygen scavenging. The scavenging anneal may be performed using spike annealing, with the time duration being milliseconds, for example, between about 10 milliseconds and about 500 milliseconds. The temperatures of the respective wafer may be in the range between about 400° C. and about 1100° C. In accordance with some exemplary embodiments, the temperature is in the range between about 700° C. and about 1,000° C.

Figure 16:
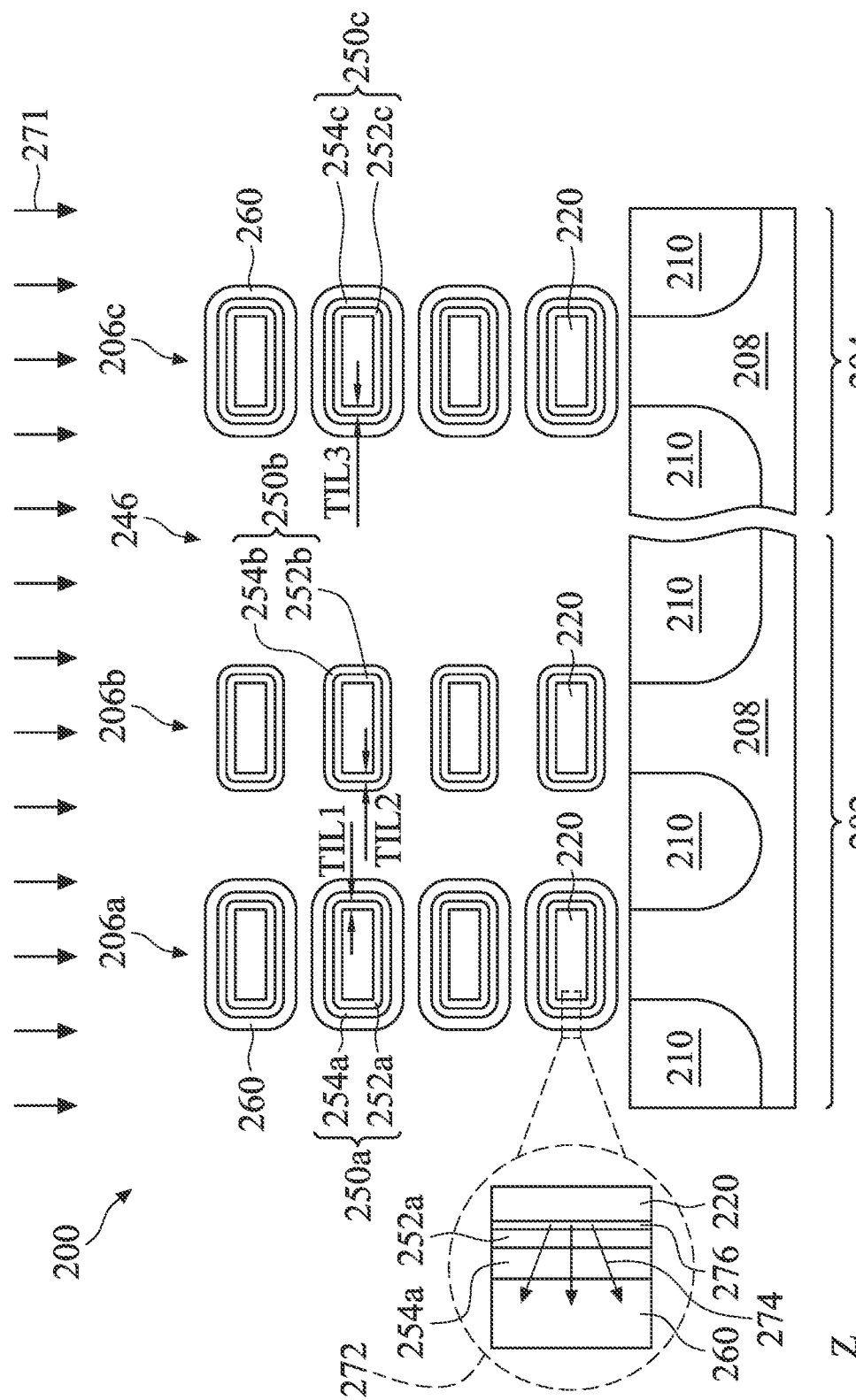

The oxygen scavenging process deprives oxygen from at least the bottom portion of the interfacial layers 252a and 252c, and hence the silicon in the interfacial layer 252a and 252c remains to form an additional silicon layer on top of the crystalline silicon layer of the nanowires 220. FIG. 16 illustrates a magnified view of a portion 272. Arrows 274 are shown to indicate the movement of oxygen atoms due to the scavenging. Accordingly, amorphous silicon layer 276 is formed. The additional silicon layer is formed of the remaining silicon of the interfacial layer 252a (252c) after oxygen is scavenged from the bottom portion of the interfacial layer 252a (252c). During the scavenging anneal process, the high-k dielectric layer 254a (254c) may intermix with the top portion of the interfacial layers 252a (252c) and the oxygen scavenged from the bottom portion of the interfacial layers 252a (252c) to form an intermix compound, which may be a metal silicate. The intermix compound is likely to have increased oxygen content. For example, when the high-k dielectric layer 254a comprises $HfO_2$, intermix compound comprises hafnium silicate ($HfSiO_4$). When the high-k dielectric layer 254a comprises $ZrO2$, intermix compound comprises zirconium silicate ($ZrSiO4$).

The oxygen scavenging process chemically reduces the interfacial layers 252a and 252c. The interfacial layer 252a thus has a reduced thickness (e.g., about 10% to about 50% thinner), which is smaller than that of the interfacial layer 252b, or may even be eliminated (fully converted). The interfacial layer 252b may still grow due to the oxide regrowth. The interfacial layer 252c also suffers from a thickness loss, but is still larger than the thickness of the interfacial layer 252b.

Figure 17:
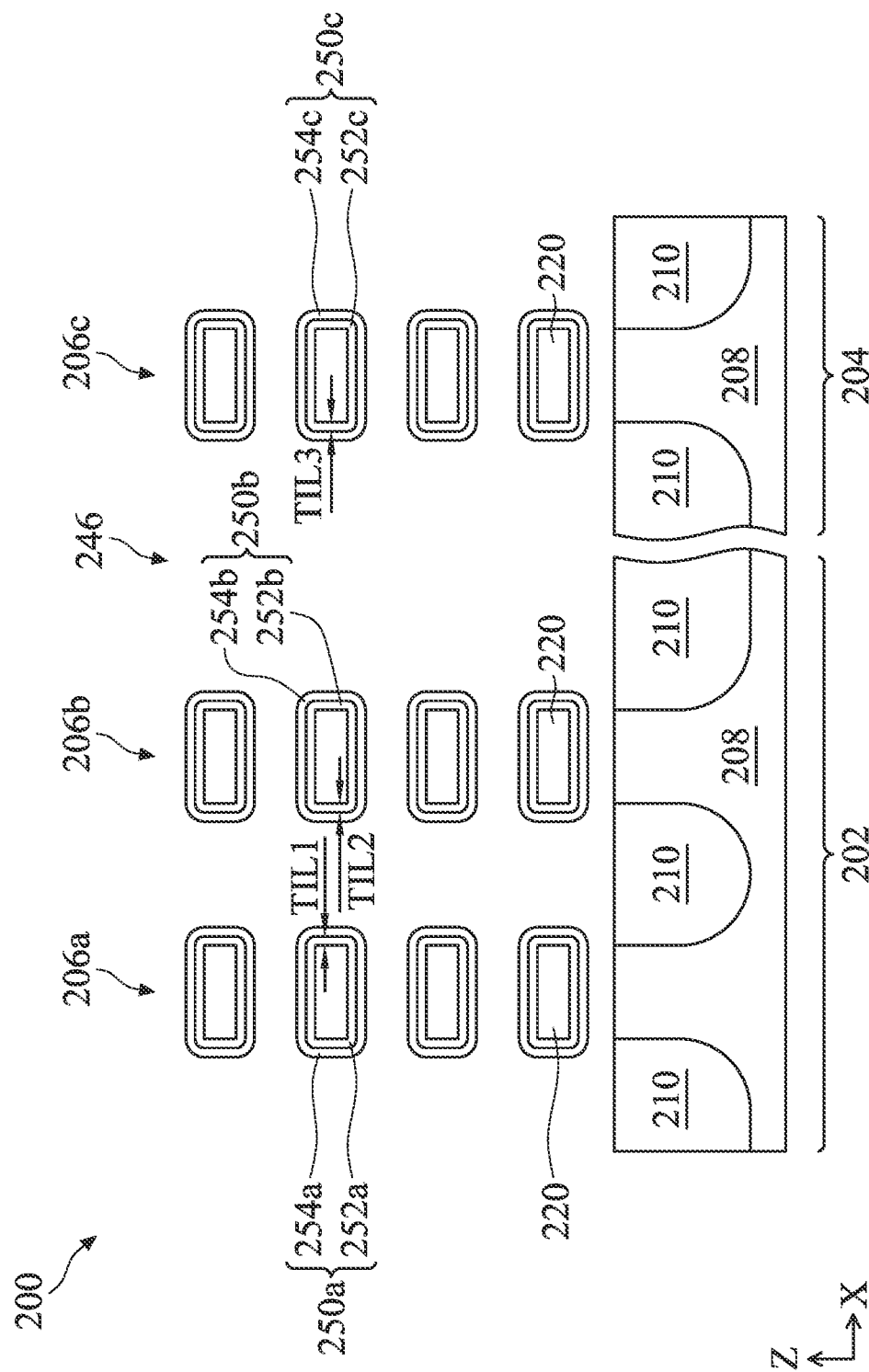
Figure 18:
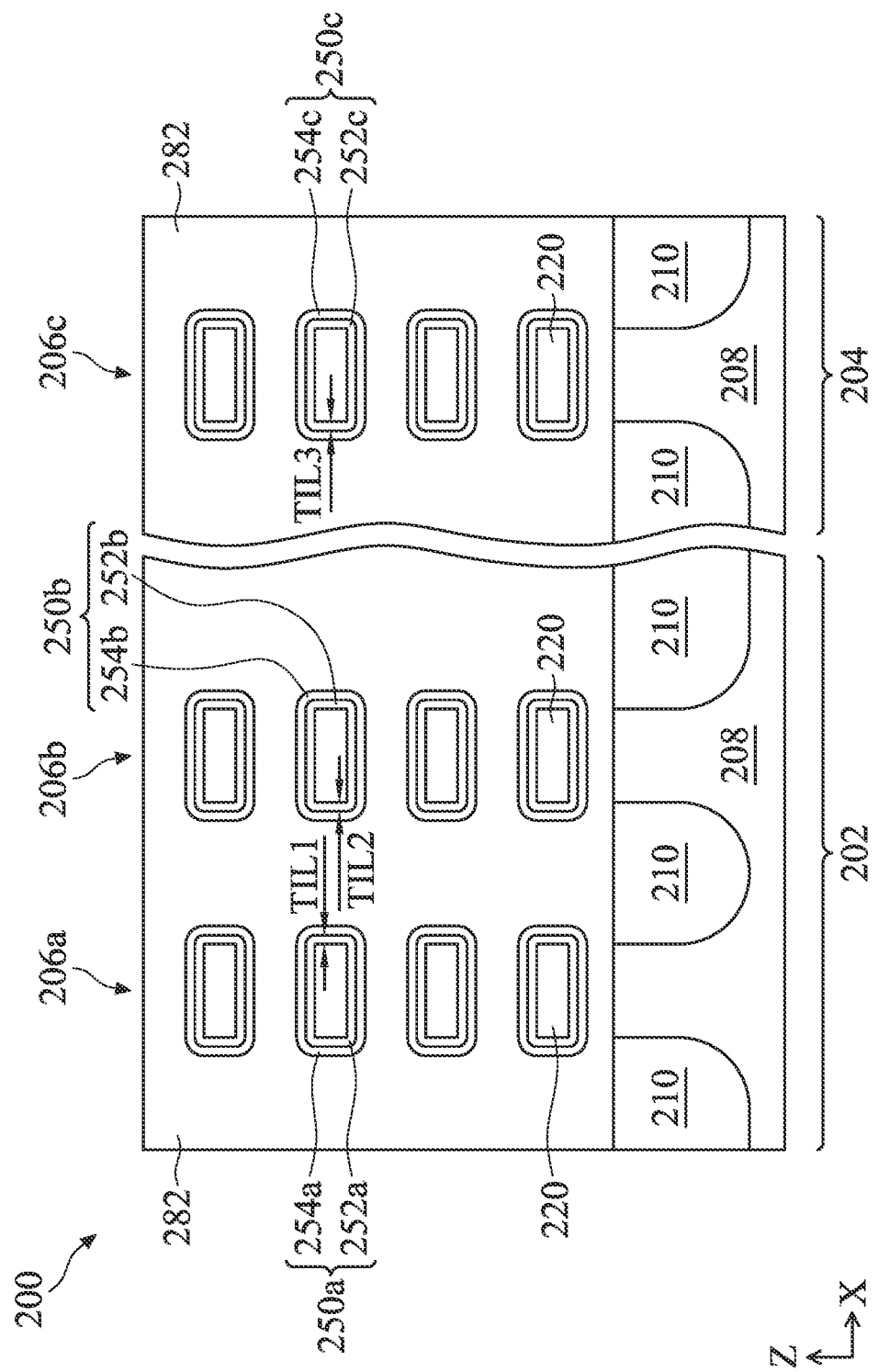

At operation 122, the method 100 (FIG. 2D) removes the capping layer 260 in a selective etching process, exposing the gate dielectric layers 250a, 250b, and 250c in the gate trenches 246, as shown in FIG. 17. The selective etching process can include dry etching, wet etching, reactive ion etching (RIE), and/or other suitable processes. With varying thickness of the interfacial layers, consequently, the gate dielectric layer 250a has a first CET thickness which is the thinnest suiting high-speed application, the gate dielectric layer 250b has a second CET thickness which is medium suiting low-power and low-leakage application, and the gate dielectric layer 250c has the thickest CET thickness suiting high-voltage application.

At operation 124, the method 100 (FIG. 2B) forms gate electrode layers 282 in gate trenches, wrapping gate dielectric layers 250a, 250b, and 250c in the core area and the I/O area. In the illustrated embodiments, the GAA core device structures 206a and 206b are adjacent and share the same gate electrode layer, while the GAA I/O device structure 206c has a separate gate electrode layer. The gate electrode layer 282 is a conductive layer that includes one or more metal layers, such as work function metal layer(s), conductive barrier layer(s), and metal fill layer(s). The gate electrode layer 282 may be formed separately for n-type and p-type transistors which may use different metal layers. The work function metal layer may be a p-type or an n-type work function layer. The p-type work function layer comprises a metal with a sufficiently large effective work function, selected from but not restricted to the group of titanium nitride (TiN), tantalum nitride (TaN), ruthenium (Ru), molybdenum (Mo), tungsten (W), platinum (Pt), or combinations thereof. The n-type work function layer comprises a metal with sufficiently low effective work function, selected from but not restricted to the group of titanium (Ti), aluminum (Al), tantalum carbide (TaC), tantalum carbide nitride (TaCN), tantalum silicon nitride (TaSiN), titanium silicon nitride (TiSiN), or combinations thereof. The gate electrode layer 282 may comprise multiple work function metal layers, such as a first metal layer and a second metal layer. As an example, the first metal layer may include TiN, and the second metal layer may include TiAl or other combinations of Ti, Ta, C, Al, such as TiAlC or TaAlC. The gate electrode layer 282 also includes a metal fill layer. The metal fill layer may include aluminum (Al), tungsten (W), cobalt (Co), and/or other suitable materials. In various embodiments, the metal fill layer of the gate electrode layer 282 may be formed by plating, ALD, PVD, CVD, e-beam evaporation, or other suitable process. In various embodiments, a CMP process may be performed to remove excessive metal from the metal layer of the gate stack, and thereby provide a substantially planar top surface.

At operation 126 of the method 100 (FIG. 2B), the semiconductor device 200 may undergo further processing to form various features and regions known in the art. For example, subsequent processing may form contact openings, contact metal, as well as various contacts/vias/lines and multilayers interconnect features (e.g., metal layers and interlayer dielectrics), configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or eliminated in accordance with various embodiments of the method 100.

Although not intended to be limiting, one or more embodiments of the present disclosure provide many benefits to a semiconductor device and the formation thereof. For example, embodiments of the present disclosure provide GAA high-speed devices, GAA low-power/low-leakage devices, and GAA high voltage devices on the same substrate and in the same integrated circuit. The GAA high-speed devices and the GAA low-power/low-leakage devices are placed in a core area of the IC, for example, for high-speed or low-power circuits, while the GAA high voltage devices are placed in an I/O area of the IC for implementing I/O circuits or ESD circuits. The GAA high-speed devices, GAA low-power/low-leakage devices, and GAA high-voltage devices have varying gate dielectric thickness to create performance differences in the three types of the devices. The present embodiments enable circuit designers to optimize the circuits in different areas of the IC by choosing different types of devices.

In one exemplary aspect, the present disclosure is directed to an integrated circuit. The integrated circuit includes a substrate having a first region and a second region; a first gate-all-around (GAA) device located in the first region, the first GAA device including: a first channel member extending longitudinally in a first direction; a first gate structure wrapping a channel region of the first channel member, the first gate structure including a first interfacial layer, the first interfacial layer having a first thickness measured in a second direction generally perpendicular to the first direction; a second GAA device located in the first region, the second GAA device including: a second channel member extending longitudinally in the first direction; and a second gate structure wrapping a channel region of the second channel member, the second gate structure including a second interfacial layer, the second interfacial layer having a second thickness measured in the second direction, the second thickness being greater than the first thickness; and a third GAA device located in the second region, the third GAA device including: a third channel member extending longitudinally in the first direction; and a third gate structure wrapping a channel region of the third channel member, the third gate structure including a third interfacial layer, the third interfacial layer having a third thickness measured in the second direction, the third thickness being greater than the second thickness. In some embodiments, a ratio of the second thickness to the first thickness is between about 1.1 and about 1.2. In some embodiments, the first thickness is between about 5 Angstroms and 20 Angstroms. In some embodiments, the third thickness is between about 20 Angstroms and 40 Angstroms. In some embodiments, each of the first, second, and third interfacial layers includes silicon dioxide. In some embodiments, the first gate structure further includes a first dielectric layer wrapping the first interfacial layer, wherein the second gate structure further includes a second dielectric layer wrapping the second interfacial layer, wherein the third gate structure further includes a third dielectric layer wrapping the third interfacial layer and wherein thicknesses of the first, second, and third dielectric layers measured in the second direction are substantially equal. In some embodiments, each of the first, second, and third dielectric layers includes a material selected from the group of materials consisting of SiN, SiON, SiCON, SiOC, $HfO_2$, and $Al_2O_3$. In some embodiments, the second dielectric layer has a higher concentration of nitrogen than the first and third dielectric layers. In some embodiments, the first and second GAA devices are core devices of the integrated circuit, and wherein the third GAA device is an input/output (I/O) device of the integrated circuit. In some embodiments, the first GAA device includes a first amorphous silicon layer between the first interfacial layer and the first channel member, the second interfacial layer is in direct contact with the second channel member, and the third GAA device includes a second amorphous silicon layer between the third interfacial layer and the third channel member.

In another exemplary aspect, the present disclosure is directed to an integrated circuit device. The integrated circuit device includes a core device including: a first channel member; a first gate structure engaging the first channel member, the first gate structure including a first interfacial layer wrapping a channel region of the first channel member; a second channel member; and a second gate structure engaging the second channel member, the second gate structure including a second interfacial layer wrapping a channel region of the second channel member, wherein a thickness of the second interfacial layer in a direction generally perpendicular to a longitudinal axis of the second channel member is greater than a thickness of the first interfacial layer in a direction generally perpendicular to a longitudinal axis of the first channel member; and an input/output (I/O) device including: a third channel member; and a third gate structure engaging the third channel member, the third gate structure including a third interfacial layer wrapping a channel region of the third channel member, wherein a thickness of the third interfacial layer in a direction generally perpendicular to a longitudinal axis of the third channel member is greater than the thickness of the second interfacial layer. In some embodiments, a ratio of the thickness of the second interfacial layer to the thickness of the first interfacial layer is between about 1.1 and about 1.2. In some embodiments, the thickness of the first interfacial layer is between about 5 Angstroms and 20 Angstroms. In some embodiments, the longitudinal axes of the first channel member, the second channel member, and the third channel member are parallel. In some embodiments, the first interfacial layer, the second interfacial layer, and the third interfacial layer include silicon dioxide.

In another exemplary aspect, the present disclosure is directed to a method. The method includes providing a structure having a first channel member, a second channel member, and a third channel member, wherein the first channel member and the second channel member are located in a core region of an integrated circuit device, and the third channel member is located in an input/output (I/O) region of the integrated circuit device; forming, by a first process, a first oxide layer and a second oxide layer, the first oxide layer wrapping a channel region of the first channel member, the second oxide layer wrapping a channel region of the second channel member; forming, by a second process different from the first process, a third oxide layer wrapping a channel region of the third channel member; forming a first dielectric layer, a second dielectric layer, and a third dielectric layer over the first oxide layer, the second oxide layer, and the third oxide layer, respectively; forming a first capping layer, a second capping layer, and a third capping layer over the first dielectric layer, the second dielectric layer, and the third dielectric layer, respectively; removing the second capping layer to expose the second dielectric layer, wherein the first capping layer and the third capping layer respectively remain over the first dielectric layer and the third dielectric layer after the removing of the second capping layer; and after removing the second capping layer, performing an annealing process to increase a thickness of the second oxide layer. In some embodiments, after the annealing process, a ratio of the thickness of the second oxide layer to a thickness of the first oxide layer is between about 1.1 and about 1.2, and wherein a thickness of the third oxide layer is greater than the thickness of the second oxide layer. In some embodiments, the second process is performed prior to the first process, the method further includes, before performing the first process, forming, by the second process, the third oxide layer wrapping the channel region of the first channel member and the channel region of the second channel member; forming an etch mask covering the I/O region of the integrated circuit device; removing the third oxide layer from the channel region of the first channel member and from the channel region of the second channel member while the etch mask covers the I/O region of the integrated circuit device; and removing the etch mask to expose the third oxide layer wrapping the channel region of the third channel member. In some embodiments, the first process includes a treatment of the first channel member and the second channel member with $H_2SO_4$, $H_2O_2$, or a combination thereof. In some embodiments, performing the annealing process includes a spike annealing process having a nitrogen-containing ambient environment, an initial temperature between about 500 degrees Celsius and about 700 degrees Celsius, and a peak temperature between about 700 degrees Celsius and about 900 degrees Celsius.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate having a first region and a second region;
a first transistor located in the first region, the first transistor including:
a first channel layer suspended above the substrate;
a first gate dielectric layer fully wrapping around the first channel layer, the first gate dielectric layer having a first thickness; and
a first gate structure on the first gate dielectric layer;
a second transistor located in the first region, the second transistor including:
a second channel layer suspended above the substrate;
a second gate dielectric layer fully wrapping around the second channel layer, the second gate dielectric layer having a second thickness, the second thickness being greater than the first thickness; and
a second gate structure on the second gate dielectric layer; and
a third transistor located in the second region, the third transistor including:
a third channel layer suspended above the substrate;
a third gate dielectric layer fully wrapping around the third channel layer, the third gate dielectric layer having a third thickness, the third thickness being greater than the second thickness; and
a third gate structure on the third gate dielectric layer,
wherein the first gate dielectric layer includes a first interfacial layer and a first high-k dielectric layer, the second gate dielectric layer includes a second interfacial layer and a second high-k dielectric layer, the third gate dielectric layer includes a third interfacial layer and a third high-k dielectric layer, and wherein the first interfacial layer is thinner than the second interfacial layer, and the second interfacial layer is thinner than the third interfacial layer,
wherein the first gate dielectric layer further includes a metal silicate layer interposing the first interfacial layer and the first high-k dielectric layer, and wherein in the second gate dielectric layer the second interfacial layer is in physical contact with the second high-k dielectric layer.

2. The semiconductor device of claim 1, wherein the first, second, and third high-k dielectric layers have substantially a same thickness.

3. The semiconductor device of claim 2, wherein each of the first, second, and third high-k dielectric layers has a thickness between about 20 Angstroms and about 100 Angstroms.

4. The semiconductor device of claim 1, wherein a thickness of the third interfacial layer is about 2 times to about 4 times of a thickness of the first interfacial layer.

5. The semiconductor device of claim 1, wherein a thickness of the second interfacial layer is about 1.1 times to about 1.2 times of a thickness of the first interfacial layer.

6. The semiconductor device of claim 1, wherein the second gate dielectric layer has a higher concentration of nitrogen than the first and third gate dielectric layers.

7. The semiconductor device of claim 1, wherein the first region is a core region and the second region is an input/output region.

8. The semiconductor device of claim 1, wherein the first gate structure continuously extends to the second gate structure.

9. A semiconductor device, comprising:
a substrate;
a first multi-gate transistor on the substrate, the first multi-gate transistor including:
a first crystalline silicon channel layer suspended above the substrate;
a first interfacial layer fully wrapping around the first crystalline silicon channel layer;
an amorphous silicon layer interposing the first crystalline silicon channel layer and the first interfacial layer; and
a first high-k dielectric layer on the first interfacial layer; and
a second multi-gate transistor on the substrate, the second multi-gate transistor including:
a second crystalline silicon channel layer suspended above the substrate;
a second interfacial layer fully wrapping around and in physical contact with the second crystalline silicon channel layer; and
a second high-k dielectric layer on the second interfacial layer,
wherein a thickness of the second interfacial layer is different from a thickness of the first interfacial layer, and wherein the second high-k dielectric layer has a higher concentration of nitrogen than the first high-k dielectric layer.

10. The semiconductor device of claim 9, wherein the first and second multi-gate transistor are both in a core region, and wherein the thickness of the second interfacial layer is larger than the thickness of the first interfacial layer.

11. The semiconductor device of claim 10, wherein a ratio of the thickness of the second interfacial layer to the thickness of the first interfacial layer is between about 1.1 and about 1.2.

12. The semiconductor device of claim 9, wherein the first multi-gate transistor is in an input/output region and the second multi-gate transistor is in a core region, and wherein the thickness of the second interfacial layer is smaller than the thickness of the first interfacial layer.

13. The semiconductor device of claim 12, wherein the thickness of the first interfacial layer is between about 20 Angstroms and about 40 Angstroms.

14. A semiconductor device, comprising:
a substrate having a core region and an input/output (I/O) region;
a first transistor located in the core region, the first transistor including:
a first channel layer suspended above the substrate;
a first interfacial layer fully wrapping around the first channel layer;
a first high-k dielectric layer fully wrapping around the first interfacial layer;
a first metal silicate layer interposing the first interfacial layer and the first high-k dielectric layer; and a first gate electrode on the first high-k dielectric layer;
a second transistor located in the core region, the second transistor including:
   a second channel layer suspended above the substrate;
   a second interfacial layer fully wrapping around the second channel layer;
   a second high-k dielectric layer fully wrapping around and in physical contact with the second interfacial layer; and
   a second gate electrode on the second high-k dielectric layer; and
a third transistor located in the I/O region, the third transistor including:
   a third channel layer suspended above the substrate;
   a third interfacial layer fully wrapping around the third channel layer;
   a third high-k dielectric layer fully wrapping around the third interfacial layer;
   a second metal silicate layer interposing the third interfacial layer and the third high-k dielectric layer; and
   a third gate electrode on the third high-k dielectric layer, wherein the first interfacial layer is thinner than the second interfacial layer, and the second interfacial layer is thinner than the third interfacial layer.

15. The semiconductor device of claim 14, wherein the first, second, and third high-k dielectric layers have substantially a same thickness.

16. The semiconductor device of claim 14, wherein the first, second, and third high-k dielectric layers have different concentrations of nitrogen.

17. The semiconductor device of claim 14, wherein a thickness of the third interfacial layer is about 2 times to about 4 times of a thickness of the first interfacial layer.

18. The semiconductor device of claim 14, wherein the first gate electrode continuously extends to the second gate electrode, and the third gate electrode is spaced apart from the first gate electrode and the second gate electrode.

19. The semiconductor device of claim 1, wherein the metal silicate layer includes hafnium or zirconium.

20. The semiconductor device of claim 9, wherein the first and second high-k dielectric layers have substantially a same thickness.

* * * * *